United States Patent
Kanaya

(10) Patent No.: US 6,847,073 B2
(45) Date of Patent: Jan. 25, 2005

(54) SEMICONDUCTOR DEVICE USING FERROELECTRIC FILM IN CELL CAPACITOR, AND METHOD FOR FABRICATING THE SAME

(75) Inventor: Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/648,511

(22) Filed: Aug. 27, 2003

(65) Prior Publication Data

US 2004/0094790 A1 May 20, 2004

(30) Foreign Application Priority Data

Nov. 7, 2002 (JP) ........................................ 2002-323948

(51) Int. Cl.[7] ........................ H01L 29/76; H01L 29/94; H01L 31/862; H01L 31/113; H01L 31/119
(52) U.S. Cl. ...................... 257/295; 257/306; 257/308; 257/310; 257/311; 438/3; 438/253; 438/396; 438/399
(58) Field of Search ................................ 257/295, 306, 257/308, 310, 311; 438/3, 253, 396, 399

(56) References Cited

U.S. PATENT DOCUMENTS

| 5,382,817 | A | * | 1/1995 | Kashihara et al. ........... 257/295 |
| 6,020,233 | A | * | 2/2000 | Kim ............................. 438/240 |
| 6,420,744 | B1 | * | 7/2002 | Kim et al. .................... 257/295 |
| 6,521,927 | B2 | | 2/2003 | Hidaka et al. |
| 6,521,929 | B2 | * | 2/2003 | Ozaki .......................... 257/295 |
| 6,603,161 | B2 | | 8/2003 | Kanaya et al. |
| 6,664,578 | B2 | * | 12/2003 | Lee et al. .................... 257/295 |
| 6,724,026 | B2 | * | 4/2004 | Jacob et al. ................. 257/295 |

FOREIGN PATENT DOCUMENTS

| JP | 11-17124 | 1/1999 |
| JP | 2000-307079 | 11/2000 |
| JP | 2001-257320 | 9/2001 |

\* cited by examiner

Primary Examiner—Allan R. Wilson
Assistant Examiner—Edgardo Ortiz
(74) Attorney, Agent, or Firm—Oblon, Spivak, McClelland, Maier & Neustadt, P.C.

(57) ABSTRACT

A semiconductor device includes a MOS transistor, an interlayer insulating film, a contact plug, a capacitor lower electrode, a ferroelectric film and two capacitor upper electrodes. The MOS transistor is formed on a semiconductor substrate. The interlayer insulating film covers the MOS transistor. The contact plug is connected to an impurity diffusion layer of the MOS transistor. The capacitor lower electrode is formed on the contact plug. The two capacitor upper electrodes are formed on the capacitor lower electrode with the ferroelectric film interposed therebetween. A contact area between the contact plug and the capacitor lower electrode is greater than a contact area between each of the two capacitor upper electrodes and the ferroelectric film. At least a part of a gate electrode of the MOS transistor is located just below a region of the contact plug, which region is in contact with the capacitor lower electrode.

30 Claims, 22 Drawing Sheets

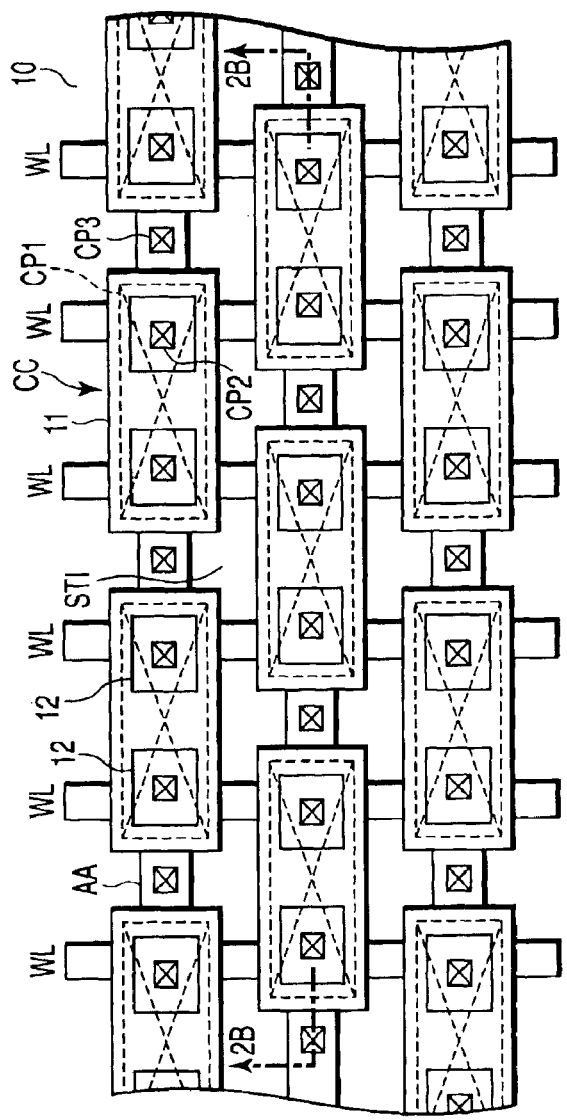
F I G. 2A
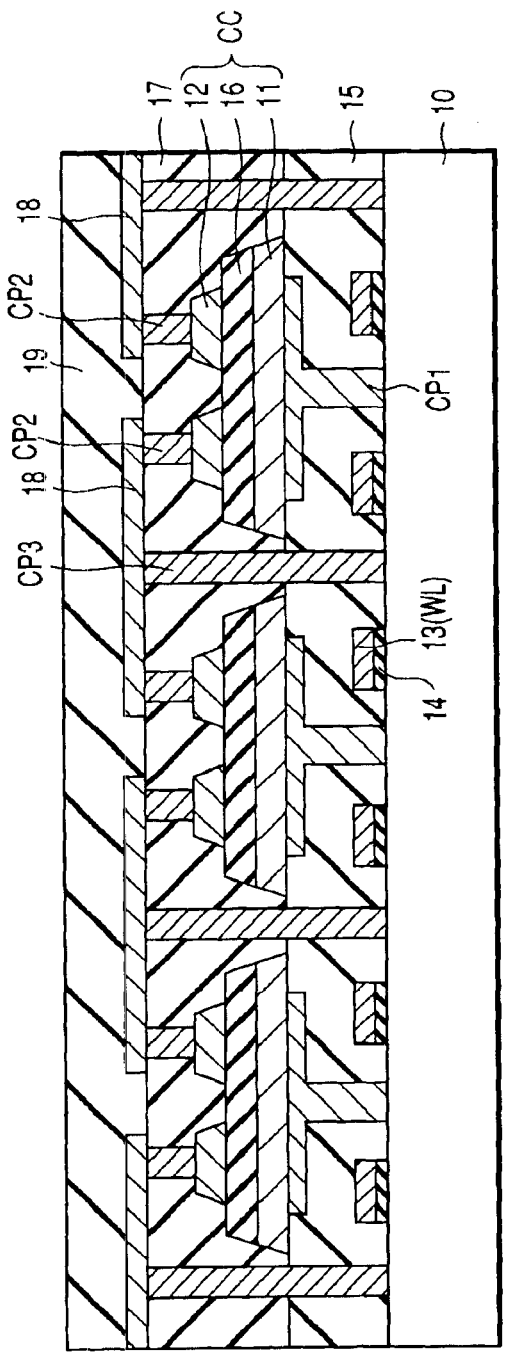
F I G. 2B

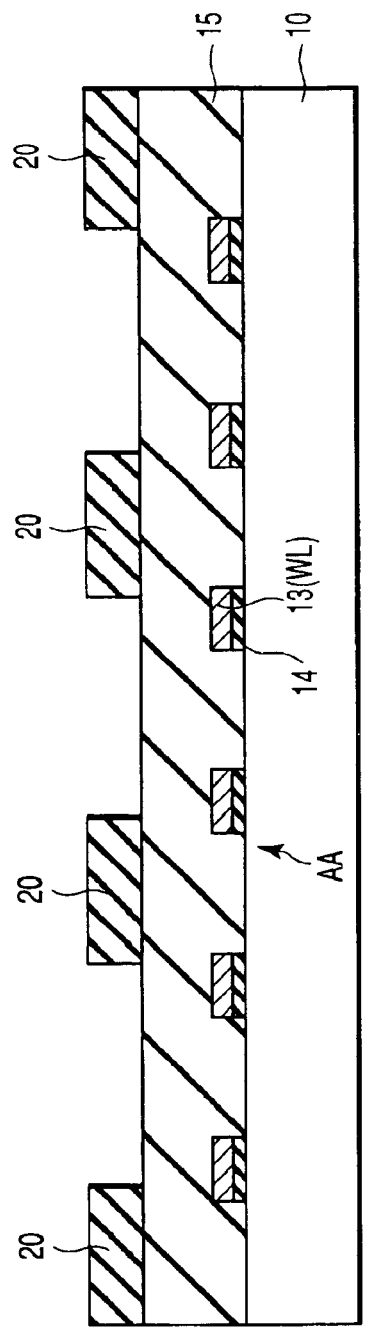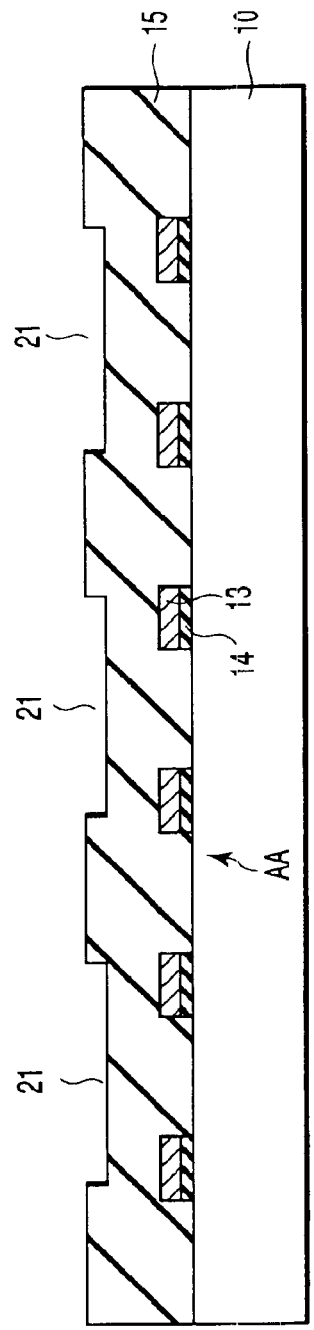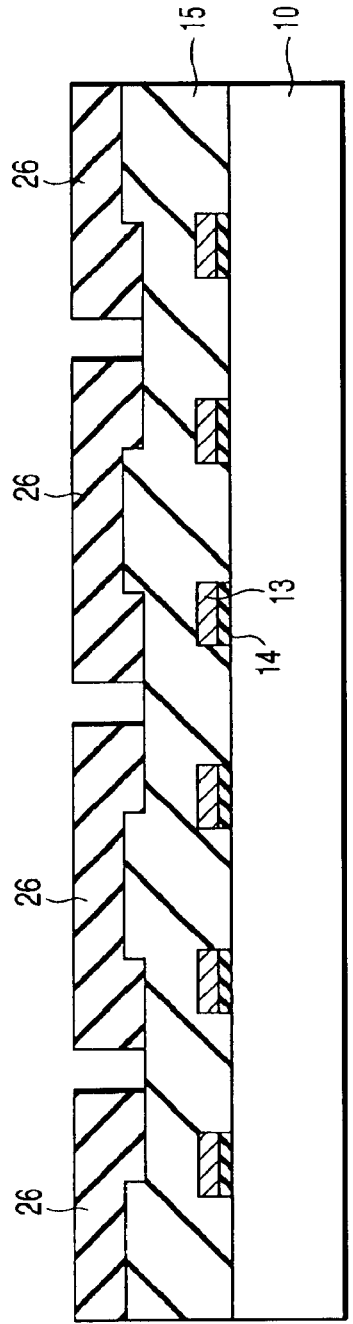
F I G. 3A
F I G. 3B
F I G. 3C

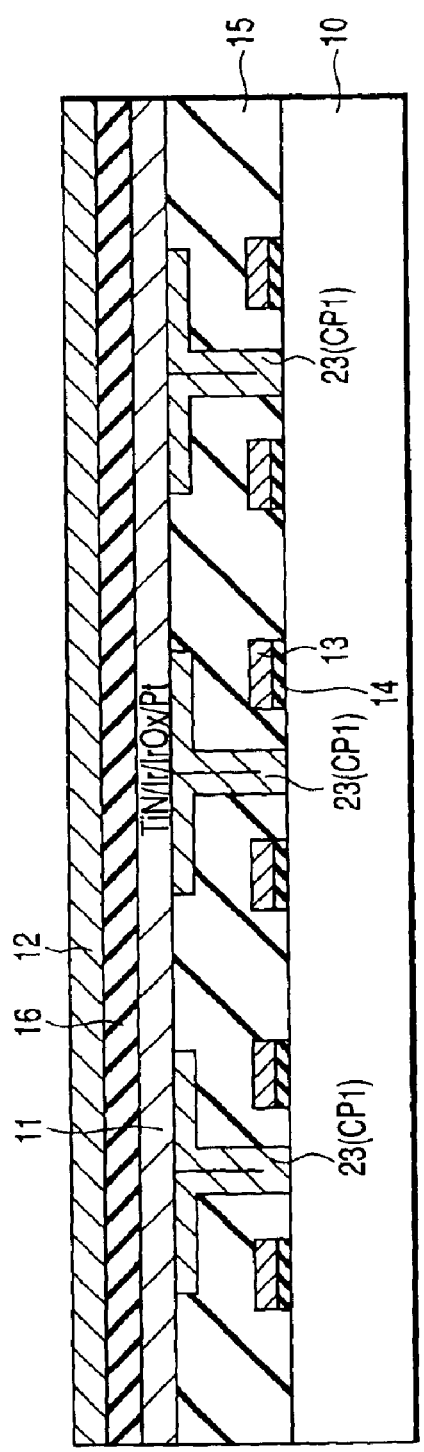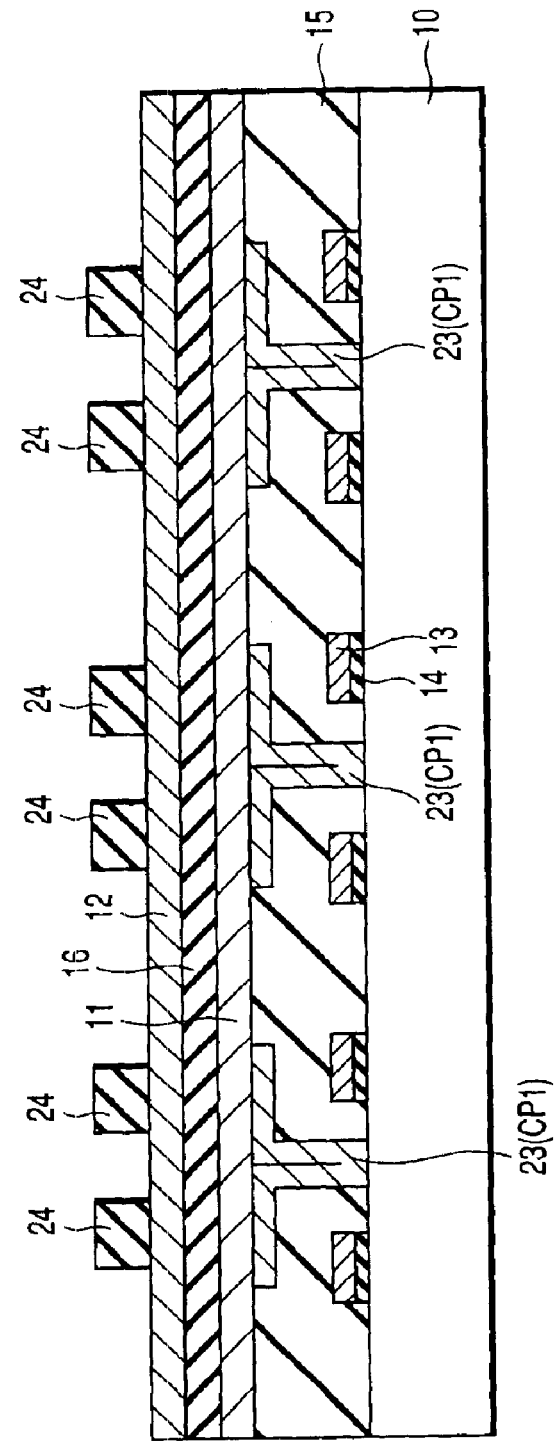
FIG. 3G
FIG. 3H

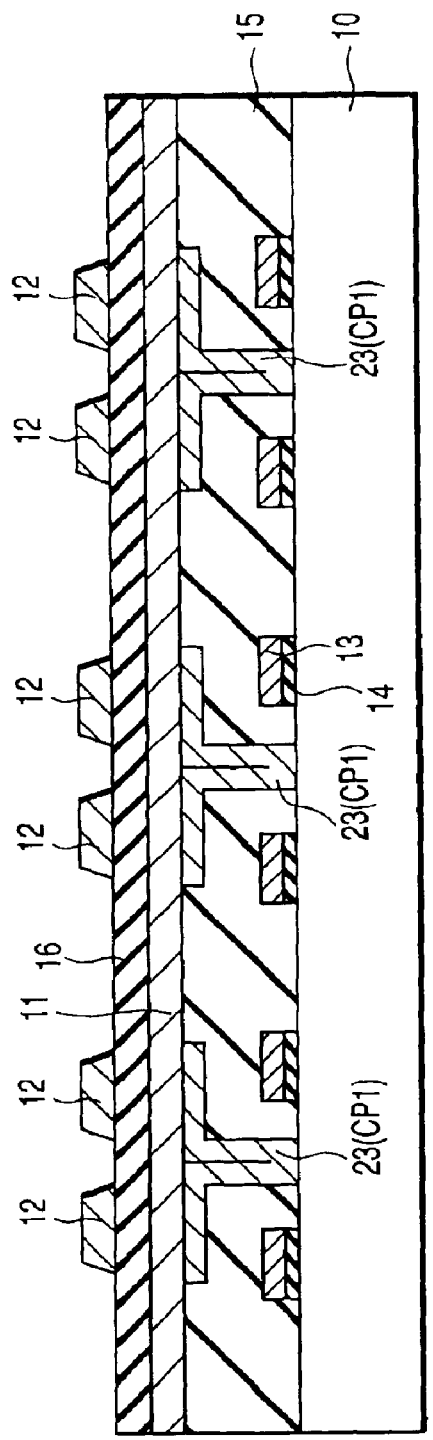
F I G. 3I
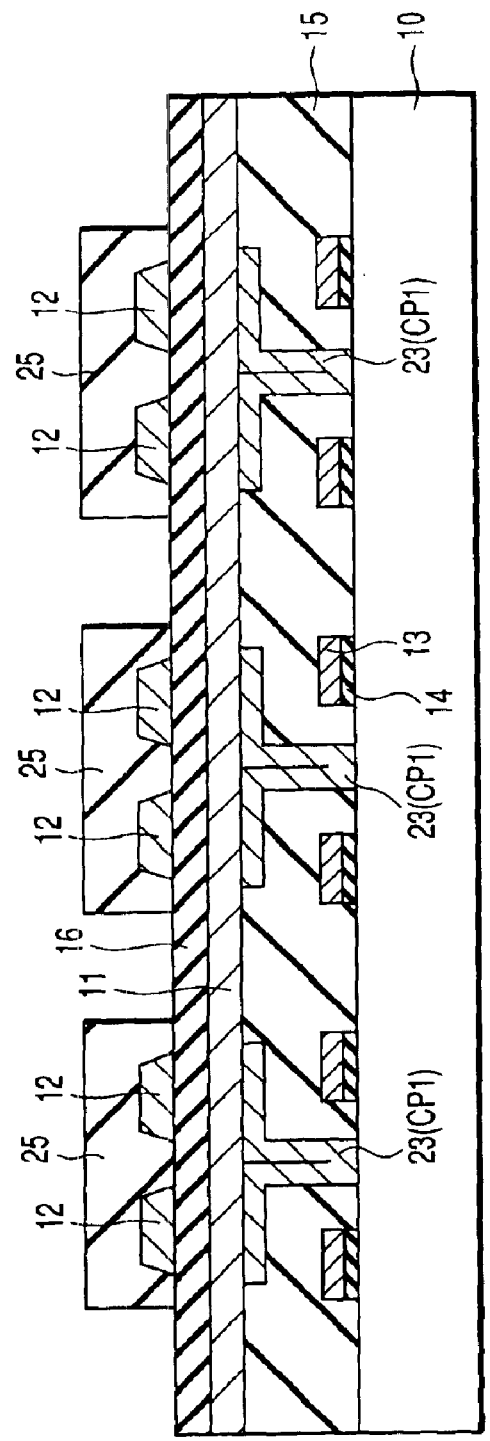
F I G. 3J

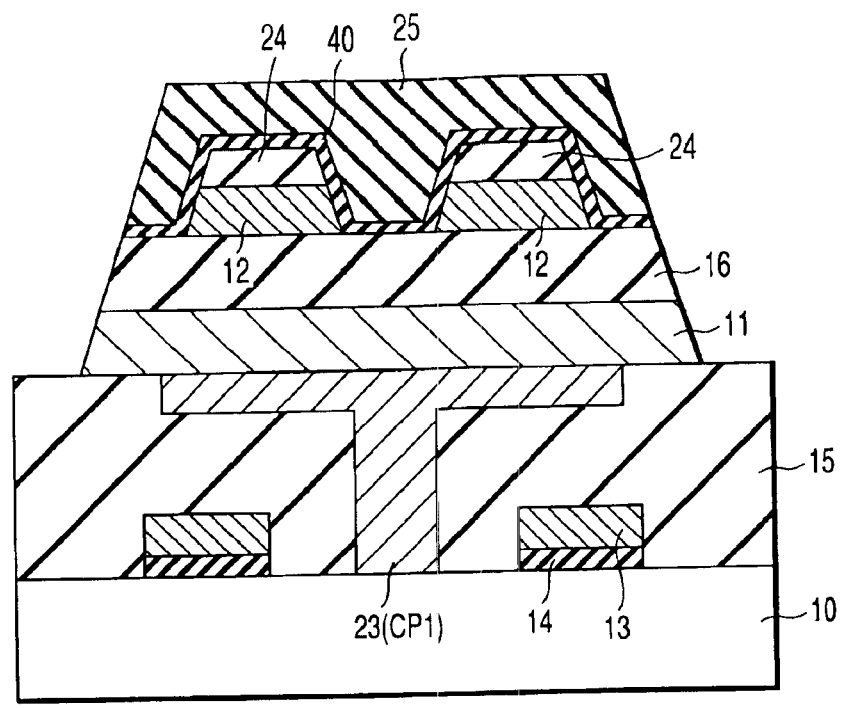
F I G. 3L
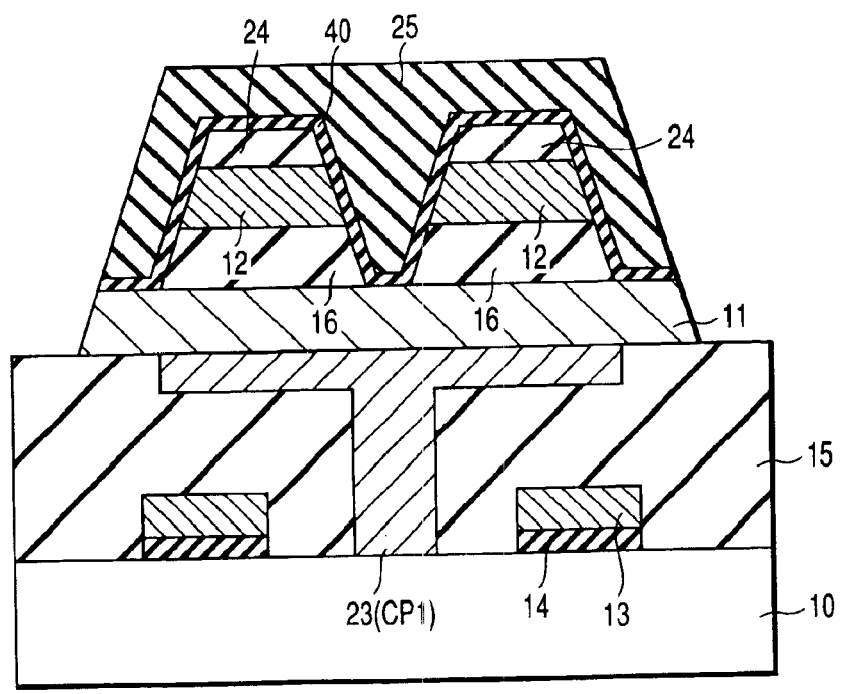
F I G. 3M

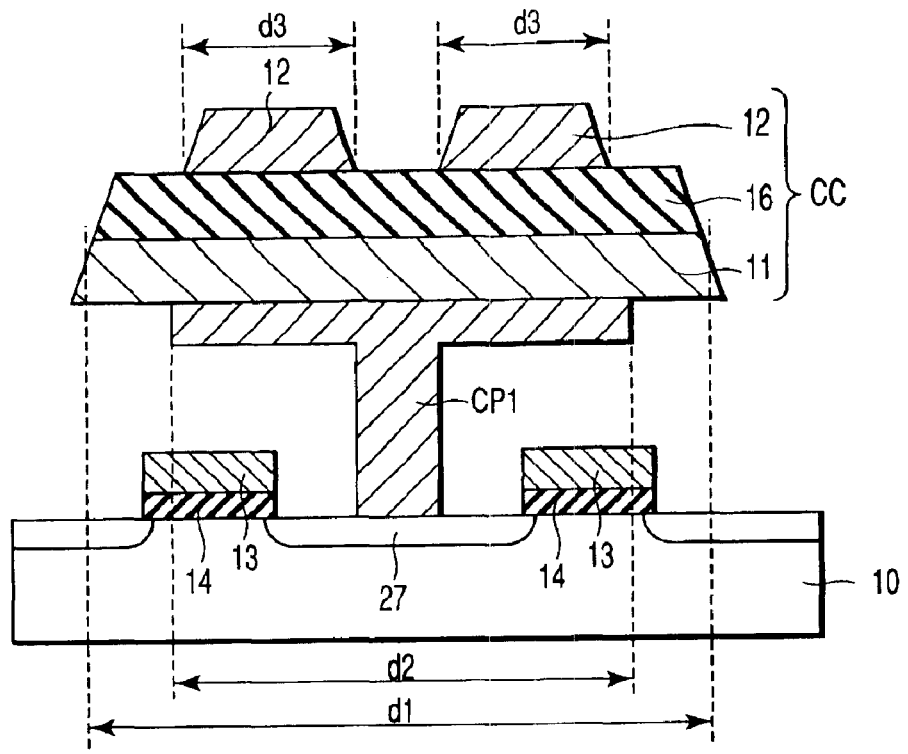
F I G. 4A
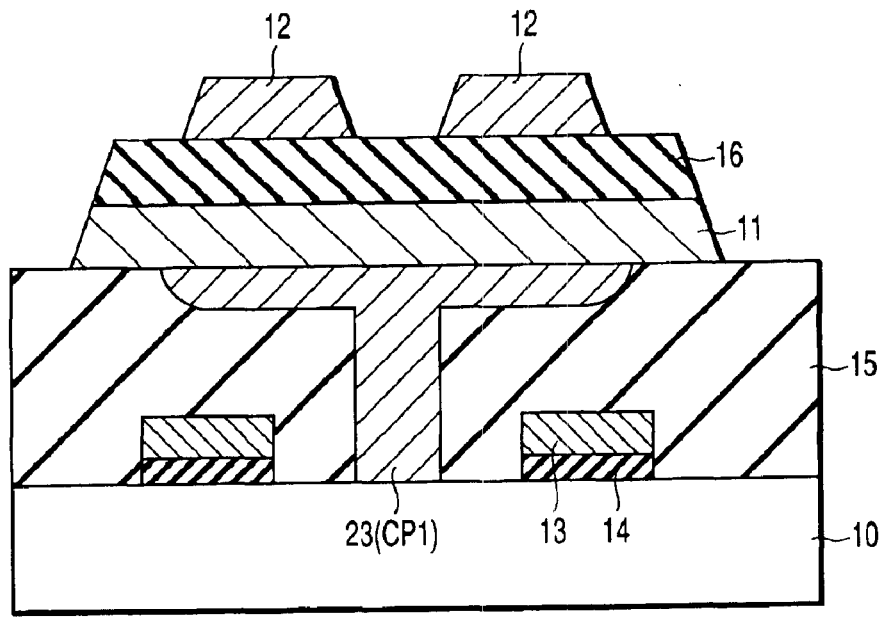
F I G. 4B

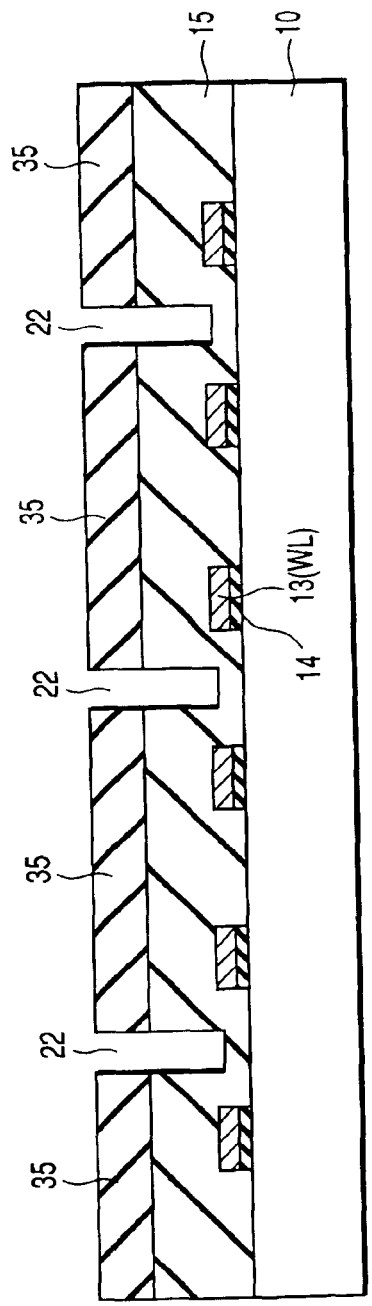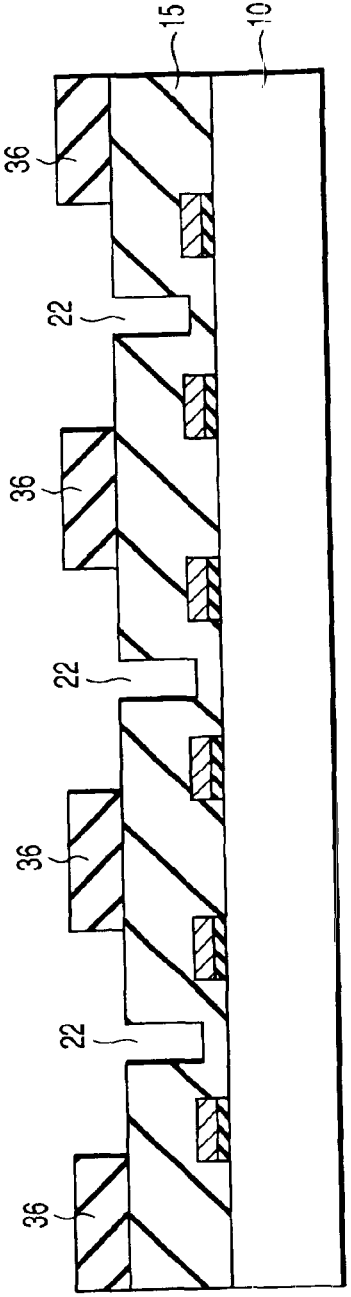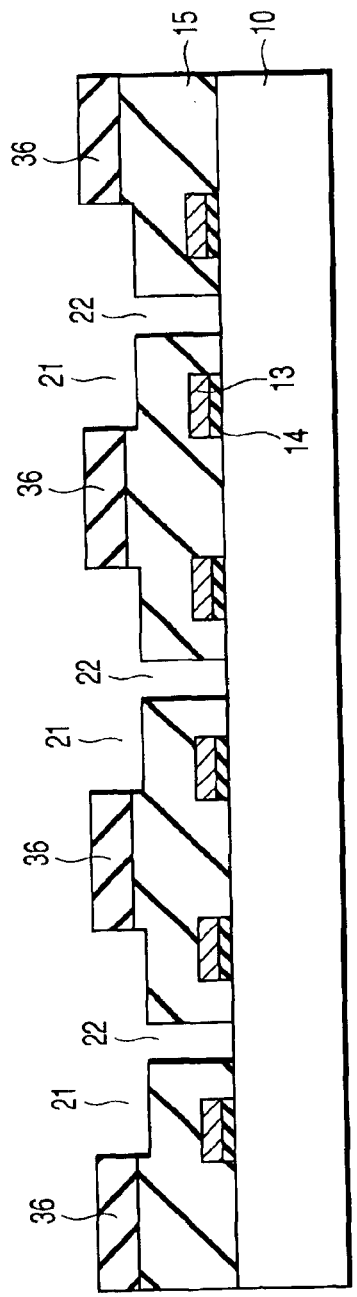
FIG. 10A
FIG. 10B
FIG. 10C

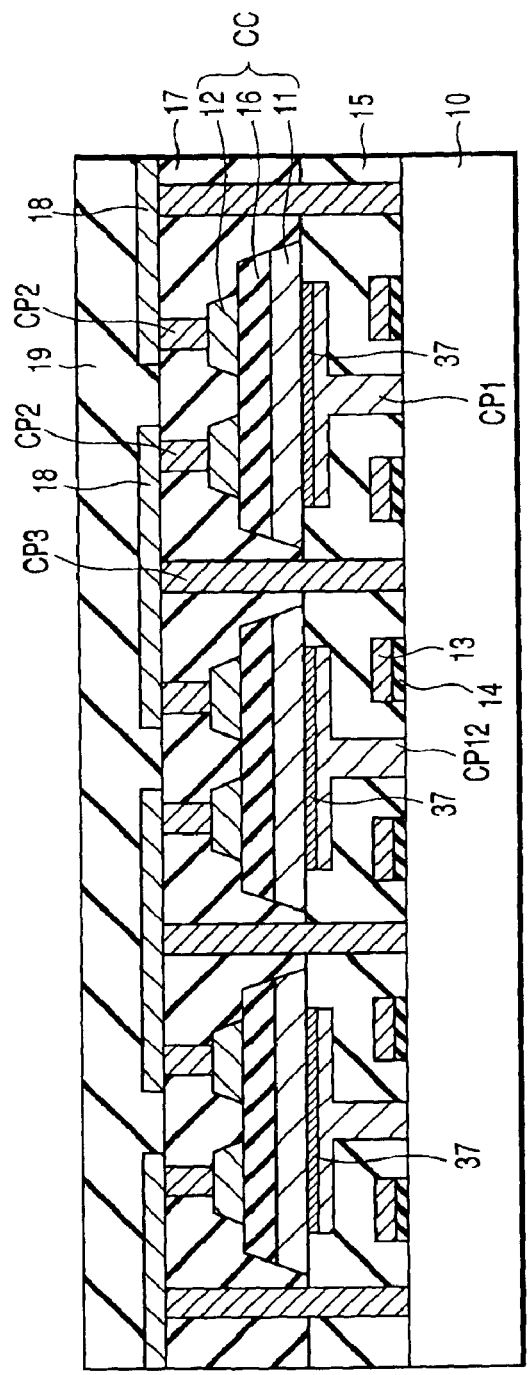
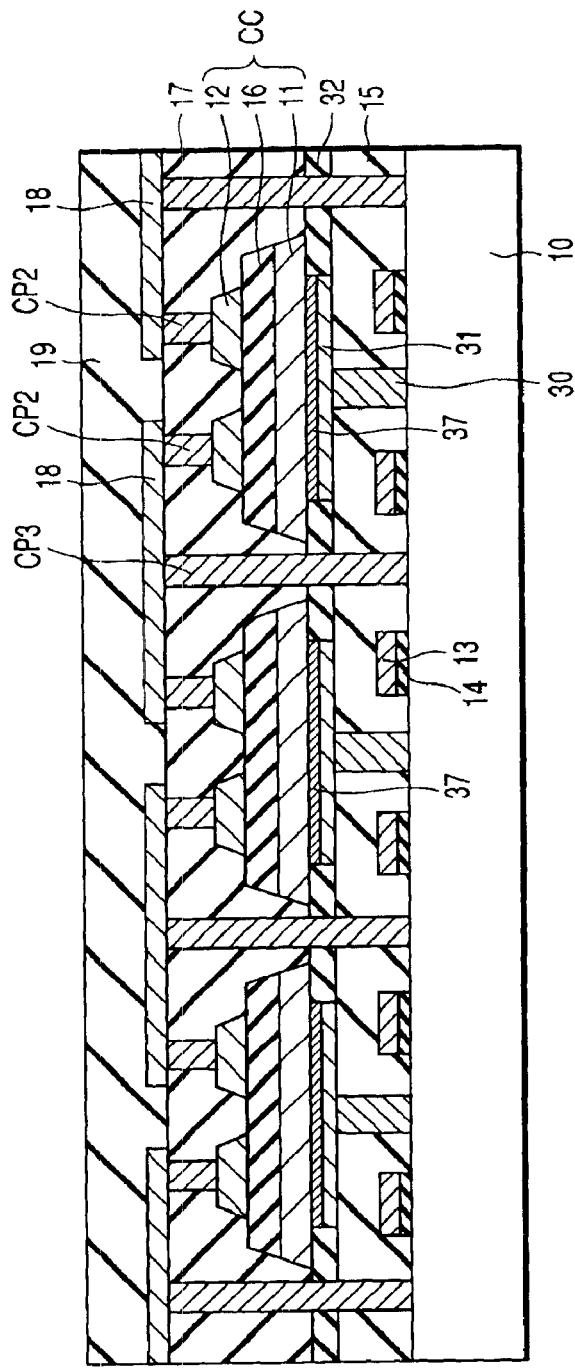
F I G. 11A
F I G. 11B

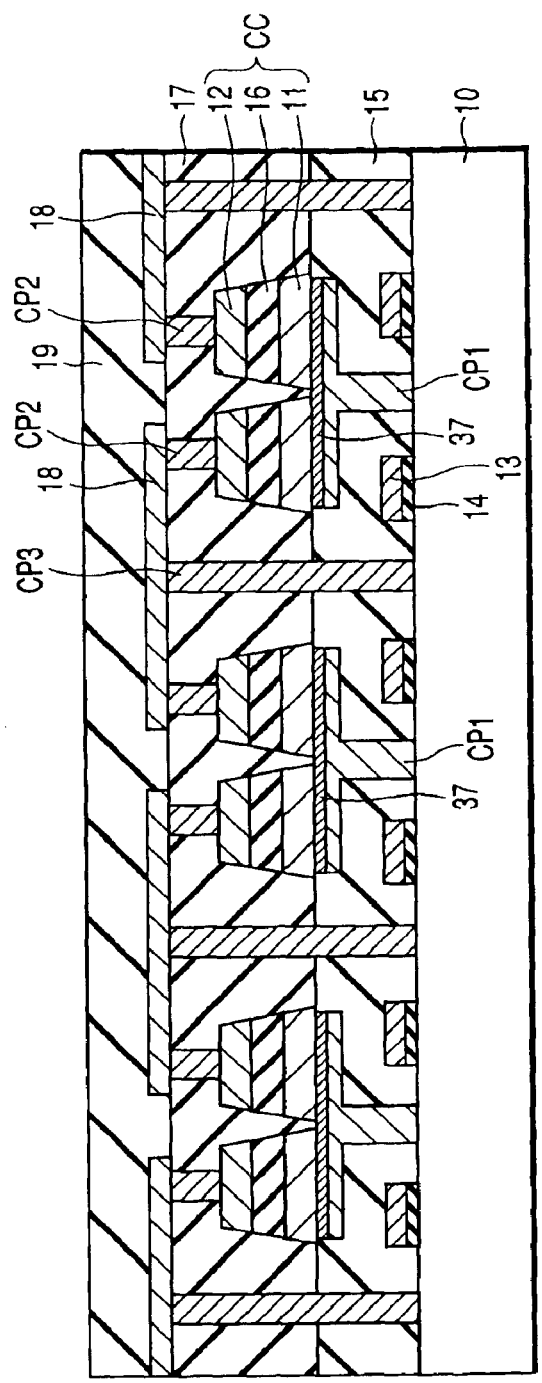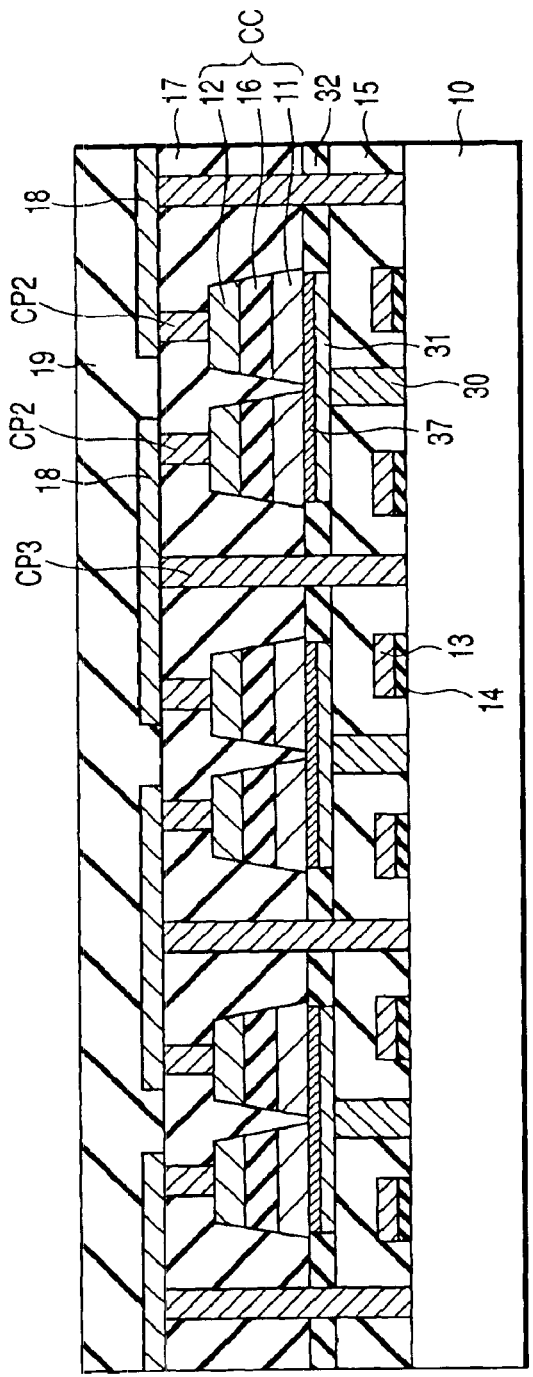
FIG. 11C
FIG. 11D $d2 > 1.1 \cdot d3$

SEMICONDUCTOR DEVICE USING FERROELECTRIC FILM IN CELL CAPACITOR, AND METHOD FOR FABRICATING THE SAME

CROSS-REFERENCE TO RELATED APPLICATIONS

This application is based upon and claims the benefit of priority from the prior Japanese Patent Application No. 2002-323948, filed Nov. 7, 2002, the entire contents of which are incorporated herein by reference.

BACKGROUND OF THE INVENTION

1. Field of the Invention

The present invention relates generally to a semiconductor device and a method of fabricating the same, and more particularly to a technique for enhancing reliability and miniaturization of a ferroelectric random access memory.

2. Description of the Related Art

A ferroelectric random access memory (RAM) using a ferroelectric film in a cell capacitor has drawn attention as a next-generation non-volatile semiconductor memory. Jpn. Pat. Appln. KOKAI Publication No. 2000-307079, for instance, discloses a ferroelectric random access memory. This memory will now be described with reference to FIG. 1A. FIG. 1A is a cross-sectional view showing the structure of a prior-art ferroelectric random access memory.

As is shown in FIG. 1A, a memory cell of the ferroelectric random access memory, like a DRAM (Dynamic Random Access Memory), comprises a cell transistor 100 and a cell capacitor 200. A ferroelectric film is used as a capacitor insulating film 210 of the cell capacitor 200.

Jpn. Pat. Appln. KOKAI Publication No. 2001-257320 discloses a memory which consists of series connected memory cells each having a transistor having a source terminal and a drain terminal and a ferroelectric capacitor inbetween said two terminals, hereafter named "Series connected TC unit type ferroelectric RAM.". This structure will now be described with reference to FIG. 1B. FIG. 1B is a cross-sectional view of a prior-art series connected TC unit type ferroelectric RAM.

As is shown in FIG. 1B, in the series connected TC unit type ferroelectric RAM, two cell capacitors share a capacitor lower electrode 220. Two capacitor upper electrodes 230 are provided over the lower electrode 220, with ferroelectric films 210 interposed. The lower electrode 220 is electrically connected to two cell transistors 100 via a contract plug 240.

In the prior-art series connected TC unit type ferroelectric RAM, however, a resistance between the capacitor lower electrode and the contact plug is high. Consequently, the reliability of the ferroelectric RAM lowers and the yield of manufacture deteriorates.

Conventionally, the use of tungsten or polysilicon as materials of contact plugs has been studied. However, these materials tend to be oxidized by high-temperature oxygen treatment for crystallizing a ferroelectric film of a cell capacitor, or high-temperature oxygen recover treatment for recovering a damage due to anisotropical etching. This leads to an increase in contact resistance between the capacitor lower electrode and the contact plug, and consequently to a decrease in yield.

A means for solving this problem is to increase a contact area between the capacitor lower electrode and the contact plug. From standpoint of miniaturization of memory cells, it is desirable, however, that the capacitor lower electrode and capacitor upper electrode have the same size. But, it is difficult to increase the size of the capacitor lower electrode. Besides, if the size of the contact plug is increased, as shown in FIG. 1C, miniaturization of memory cells becomes difficult. Thus, there is a problem that the miniaturization of memory cells and the decrease in contact resistance cannot be satisfied at the same time.

BRIEF SUMMARY OF THE INVENTION

A semiconductor device according to an aspect of the present invention comprises:
- a MOS transistor formed on a semiconductor substrate;
- an interlayer insulating film formed on the semiconductor substrate such that the interlayer insulating film covers the MOS transistor;
- a contact plug formed in the interlayer insulating film and connected to an impurity diffusion layer of the MOS transistor;
- a capacitor lower electrode formed on the contact plug;
- a ferroelectric film formed on the capacitor lower electrode; and
- two capacitor upper electrodes formed on the capacitor lower electrode with the ferroelectric film interposed therebetween, a contact area between the contact plug and the capacitor lower electrode being greater than a contact area between each of the two capacitor upper electrodes and the ferroelectric film, and at least a part of a gate electrode of the MOS transistor being located just below a region of the contact plug, which region is in contact with the capacitor lower electrode.

A method for fabricating a semiconductor device according to an aspect of the present invention comprises:
- forming a MOS transistor on a semiconductor substrate;
- forming a first interlayer insulating film on the semiconductor substrate, the first interlayer insulating film covering the MOS transistor;
- forming a contact plug in the first interlayer insulating film, the contact plug being connected to an impurity diffusion layer of the MOS transistor;
- forming a capacitor lower electrode on the contact plug;
- forming a ferroelectric film on the capacitor lower electrode; and
- forming two capacitor upper electrodes on the capacitor lower electrode with the ferroelectric film interposed therebetween, a contact area between the contact plug and the capacitor lower electrode being greater than a contact area between each of the two capacitor upper electrodes and the ferroelectric film, and a region of the contact plug, which region is in contact with the capacitor lower electrode, being located just above at least a part of a gate electrode of the MOS transistor.

BRIEF DESCRIPTION OF THE SEVERAL VIEWS OF THE DRAWING

FIG. 2A is a plan view of a ferroelectric random access memory (RAM) according to a first embodiment of the present invention;

FIG. 2B is a cross-sectional view taken along line 2B—2B in FIG. 2A;

FIGS. 3A to 3K are cross-sectional views illustrating in succession the steps of manufacturing the ferroelectric RAM according to the first embodiment;

FIG. 3L and FIG. 3M are cross-sectional views illustrating the steps of manufacturing the ferroelectric RAM according to the first embodiment;

FIG. 4A is a cross-sectional view of a memory cell of the ferroelectric RAM according to the first embodiment of the invention;

FIG. 4B is a cross-sectional view of a memory cell of the ferroelectric RAM according to the first embodiment of the invention;

FIGS. 10A to 10C are cross-sectional views illustrating in succession the steps of manufacturing a ferroelectric RAM according to a modification of the first to fourth embodiments of the invention;

FIGS. 11A to 11D are cross-sectional views of a ferroelectric RAM according to a modification of the first to fourth embodiments of the invention;

DETAILED DESCRIPTION OF THE INVENTION

Figure 1A:
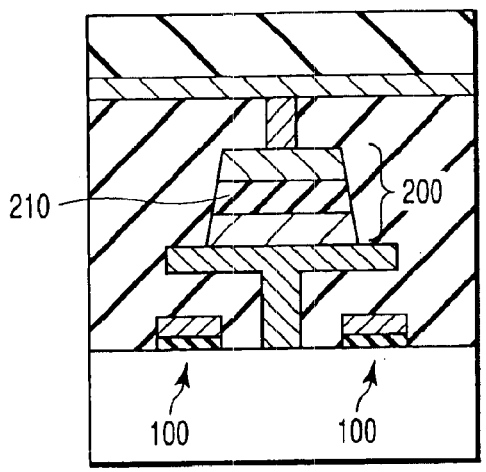
FIGS. 1A to 1C are cross-sectional views of prior-art ferroelectric random access memories.

A semiconductor device according to a first embodiment of the invention will now be described with reference to FIG. 2A. FIG. 2A is a plan view of a series connected TC unit type ferroelectric random access memory (RAM) having a COP (Capacitor Over Plug, Capacitor On Plate line) structure.

As is shown in FIG. 2A, a plurality of element regions AA, where memory cells are to be formed, are formed in stripes in a silicon substrate 10. Element isolation regions STI are formed on areas other than the element regions AA. Word lines WL are formed in stripes on the silicon substrate 10 in a direction perpendicular to a longitudinal direction of the element regions AA so as to extend over the element regions AA. Cell transistors (not shown) are formed on regions where the word lines WL and element regions AA cross each other. In addition, cell capacitors CC are formed on regions that are substantially immediately above cell transistors. The cell capacitor CC comprises a capacitor lower electrode 11 and capacitor upper electrodes 12 formed on the capacitor lower electrode 11 with ferroelectric films interposed therebetween. Two cell capacitors CC, which are adjacent to each other in the longitudinal direction of the element regions AA, share the capacitor lower electrode 11 and straddle over areas substantially above two cell transistors. The individual capacitor lower electrodes 11 are arranged in a staggered fashion in the surface of the silicon substrate 10, and the capacitor lower electrode 11 is electrically connected to one of impurity diffusion layers of two cell transistors via a contact plug CP1. The capacitor upper electrode 12, formed on the capacitor lower electrode 11 with a ferroelectric film interposed therebetween, is isolated for each cell transistor and is formed in a region substantially immediately above the cell transistor. The capacitor upper electrode is electrically connected to the other of the impurity diffusion layers of the cell transistor via contact plugs CP2 and CP3. In FIG. 2A, the capacitor lower electrodes 11 are arranged in a staggered fashion. Alternatively, the capacitor lower electrodes 11 may be arranged in a matrix.

A cross-structural structure of the series connected TC unit type ferroelectric RAM will now be described with reference to FIG. 2B. FIG. 2B is a cross-sectional view taken along line 2B—2B in FIG. 2A.

As is shown in FIG. 2B, a gate electrode 13 is formed on the silicon substrate 10 with a gate insulating film 14 interposed therebetween. The gate electrode 13 has, for example, a two-layer structure of a polysilicon film and a tungsten film. In addition, impurity diffusion layers (not shown), serving as source/drain regions, are selectively formed in the silicon substrate 10. Thus, a cell transistor is formed. An interlayer insulating film 15 is formed on the silicon substrate 10. The interlayer insulating film 15 covers the cell transistor.

Contact plugs CP1 and CP3, which are connected respectively to one and the other of the impurity diffusion layers of the cell transistor, are formed in the interlayer insulating film. The contact plug CP1 electrically connects one of the impurity diffusion layers and the capacitor lower electrode 11 of cell capacitor CC. The contact plug CP3 electrically connects the other impurity diffusion layer and the capacitor upper electrode 12. Both contact plugs are formed of, e.g. tungsten, polysilicon, or aluminum, etc. The contact plug CP1 has a top surface greater than a bottom surface thereof. That is, the contact area with the capacitor lower electrode 11 is greater than the contact area with the impurity diffusion layer. The contact plug CP1 has a substantially T-shaped form. The top surface of the contact plug CP1 overlaps at least part of the gate electrode 13.

A cell capacitor CC is formed on the contact plug CP1. The cell capacitor CC comprises the capacitor lower electrode 11 formed on the contact plug CP1, a capacitor insulating film 16 formed on the capacitor lower electrode 11, and capacitor upper electrode 12 formed on the capacitor insulating film 16. The capacitor lower electrode 11 and capacitor insulating film 16 are shared by two cell transistors. The capacitor upper electrode 12 is divided into two electrode portions 12. The capacitor lower electrode 11 covers the upper surface of the contact plug CP1 and overlaps the gate electrode 13. The capacitor lower electrode 11 and upper electrode 12 are formed of a material including a metal element of the platinum group. The capacitor insulating film 16 is formed of a ferroelectric material.

An interlayer insulating film 17 is formed on the interlayer insulating film 15. The interlayer insulating film 17 covers the cell capacitor CC. Contact plugs CP2 are formed in the interlayer insulating film 17. The contact plugs CP2 are connected to the capacitor upper electrodes 12. The contact plug CP2 is formed of, e.g. Al using Al re-flow method and CMP (Chemical Mechanical Polishing). In addition, a metal wiring layer 18 electrically connects the contact plugs CP2 and CP3. The metal wiring layer 18 is formed of e.g. TiN/AlCu/TiN using RIE (Reactive Ion Etching). As a result, a memory cell is formed, wherein both electrodes of the capacitor CC are connected between the source and drain of the cell transistor. An interlayer insulating film 19 that covers the memory cell is formed on the interlayer insulating film 17. Thus, a series connected TC unit type ferroelectric RAM is formed.

A method of manufacturing the series connected TC unit type ferroelectric RAM having the above structure will now be described with reference to FIGS. 3A to 3K. FIGS. 3A to 3K are cross-sectional views illustrating in succession the steps of fabricating the series connected TC unit type ferroelectric RAM.

Element isolation regions are formed in a silicon substrate 10 using STI (Shallow Trench Isolation) techniques (not shown). A MOS transistor is formed by a well-known technique on a element region AA surrounded by the element isolation regions. Specifically, as shown in FIG. 3A, a silicon oxide ($SiO_2$) film serving as a gate insulating film 14 is formed on the silicon substrate 10 by a thermal oxidation method, for instance. A two-layer film 13 comprising a polysilicon film and a tungsten film is deposited on the gate insulating film. The polysilicon film and tungsten film are patterned to form a plurality of striped gate electrodes 13. Then, impurities are selectively implanted in the silicon substrate 10 by an ion implantation technique, thereby forming impurity diffusion layers (not shown) serving as source/drain regions. The MOS transistor, thus formed, functions as a cell transistor of the series connected TC unit type ferroelectric RAM. Subsequently, a silicon oxide film 15 serving as an interlayer insulating film is formed on the silicon substrate 10 so as to cover the cell transistor. The interlayer insulating film 15 is then flattened.

Next, a contact plug CP1 is formed using a damascene process (dual damascene method, for example). As is shown in FIG. 3A, a mask material 20 is formed on the interlayer insulating film 15. The mask material 20 is patterned, as shown in FIG. 3A, by means of photolithography and etching.

In a subsequent step shown in FIG. 3B, the surface of the interlayer insulating film 15 is etched using the mask material 20 as a mask. A groove 21, as shown in FIG. 3B, is thus made. The groove 21 partly defines an outer wall of the contact plug CP1. The groove 21 is formed to partly overlap the gate electrode 13. The mask material 20 is then removed.

In a step shown in FIG. 3C, a mask material 26 is formed on the interlayer insulating film 15. The mask material 26 is patterned, as shown in FIG. 3C, by means of photolithography and etching.

Figure 3D:
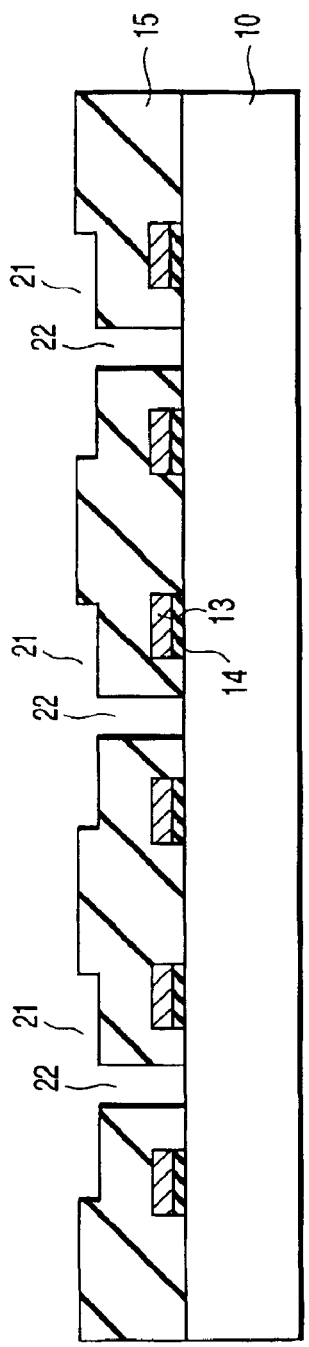

In a step shown in FIG. 3D, the interlayer insulating film 15 is etched using the mask material 26 as a mask, thereby making a contact hole 22. The contact hole 22, too, partly defines an outer wall of the contact plug CP1. Specifically, an open end of the contact hole 22 is exposed to the groove 21, and a bottom of the contact hole 22 reaches one of the impurity diffusion layers of the cell transistor. The mask material 26 is then removed. In this embodiment, the contact hole 22 is made after the groove 21 is cut. Nonetheless, the contact hole 22 may be made before the groove 21 is cut.

Figure 3E:
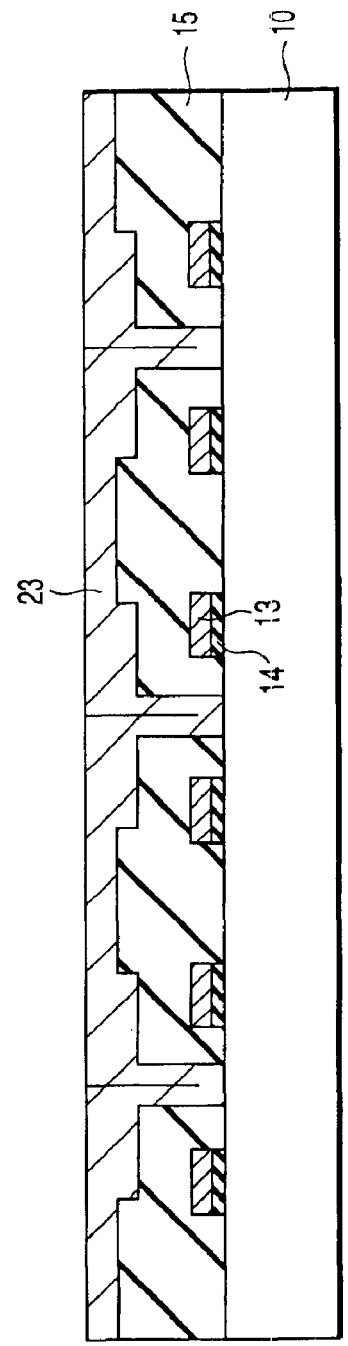

In a step shown in FIG. 3E, a thin barrier metal layer (not shown) is formed on the interlayer insulating film 15, groove 21, contact hole 22, and the impurity diffusion layer exposed to the bottom of the contact hole 22. The barrier metal layer is formed of, e.g. a Ti/TiN multi-layer film. A plug material 23 is formed on the barrier metal layer such that it is buried in the groove 21 and contact hole 22. The plug material 23 is, e.g. tungsten or polysilicon.

Figure 3F:
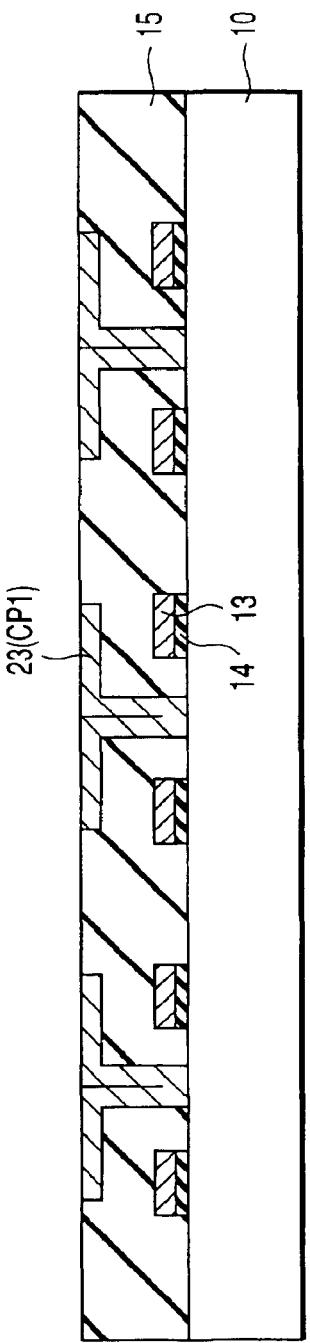

In a step shown in FIG. 3F, the plug material 23 is polished by means of CMP (Chemical Mechanical Polishing) using the interlayer insulating film 15 as a stopper. Thereby, the plug material 23 is left only in the groove 21 and contact hole 22. As a result, a T-shaped contact plug CP1, as shown in FIG. 3F, is formed.

Subsequently, a cell capacitor CC is formed on the contact plug CP1. To begin with, a capacitor lower electrode layer 11, a ferroelectric layer 16 and a capacitor upper electrode layer 12 are successively formed on the interlayer insulating film 15 and contact plug CP1, as shown in FIG. 3G. In order to crystallize the ferroelectric layer 16, rapid thermal annealing (RTA) is performed in an oxygen atmosphere. The conditions for the annealing are, for instance, 550 to 600° C. for 0.5 to 1.0 minute in $O_2$ atmosphere. The capacitor lower electrode layer 11 is formed of a material that hardly allows oxygen occurring in the rapid thermal annealing to enter the contact plug CP1. To be more specific, the capacitor lower electrode layer 11 is formed of e.g. barrier metal/Ir/IrOx/Pt, or barrier metal/Ir/Ir/IrOx/Pt/SRO (SRO:$SrRuO_3$). The barrier metal is formed of, e.g. Ti, TiN or Ti/TiN. The barrier metal may not be formed, depending on the conditions of heat treatment, such as temperature. The ferroelectric layer 16 is formed of, e.g. lead zirconate titanate ($Pb(Zr_{1-x}Ti_x)O_3$: PZT). The capacitor upper electrode layer 12 is formed of a multi-layer film of, e.g. SRO, IrOx/Ir, or Pt/SRO.

In the next step shown in FIG. 3H, a mask material 24 is formed on the capacitor upper electrode layer 12. Using photolithography and etching, the mask material 24 is patterned in accordance with a formation pattern of capacitor upper electrodes.

The mask material 24 may be a photo resist or a hard mask. The hard mask is made of $Al_2O_3$, $ZrO_x$, $SiO_2$ or TiN, or of material containing at least one material selected from the group including $Al_2O_3$, $ZrO_x$, $SiO_2$ and TiN. In the present embodiment, the mask material 24 is a photo resist.

The capacitor upper electrode layer is etched by anisotropic etching such as RIE or high-temperature RIE (at 250° C. or more), by using the mask material 24 as etching mask. Thus, a capacitor upper electrode 12 is formed as illustrated in FIG. 3I. Then, the mask material 24 is removed, because it is a photo resist. If the mask material 24 is a hard mask, it need not be removed.

Thereafter, oxygen annealing is performed, if necessary, to recover the damage made to the capacitor lower electrode 11 during the RIE. The oxygen annealing is carried out in an $O_2$ atmosphere, at 600° C. and for one hour. In some cases, it is more desirable to perform this oxygen annealing after the capacitor lower electrode is processed and a protective film of, for example, $Al_2O_3$ is then formed.

In a step shown in FIG. 3J, a mask material 25 is formed on the ferroelectric layer 16 so as to cover the capacitor upper electrodes. The mask material 25 is patterned in accordance with a formation pattern of the capacitor lower electrode. In this case, the mask material 25 is patterned such that the left mask material 25 is located just above the contact plug CP1 and the upper surface of the contact plug CP1 is completely covered with the mask material 25. In this step, too, the mask material 25 may be a photo resist or a hard mask of the type described above.

Figure 3K:
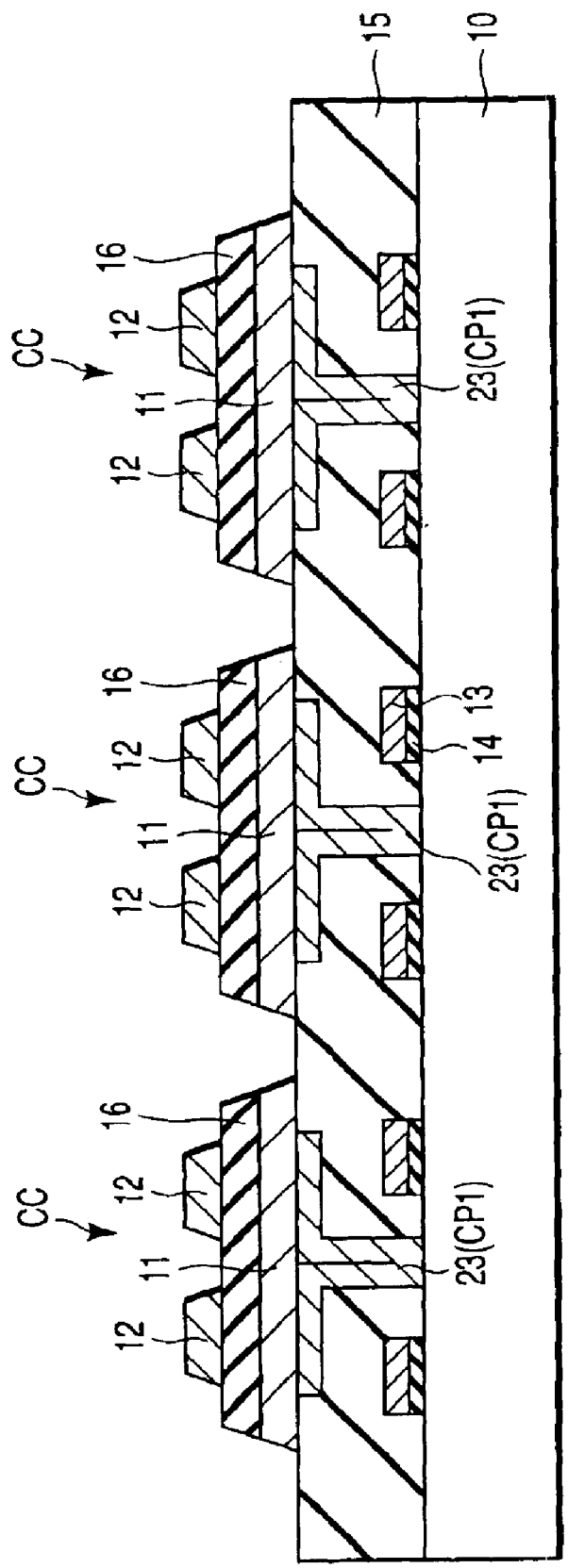

In a step shown in FIG. 3K, using the mask material 25 as a mask, the ferroelectric layer 16 and capacitor lower electrode layer 11 are etched by means of, e.g. RIE, and the capacitor lower electrode 11 is formed. The mask material 25 is then removed. If the mask material 25 is a hard mask, it is not absolutely necessary to remove the material 25.

As a result, a cell capacitor CC as shown in FIG. 3K is obtained. In this capacitor CC, the contact area between the capacitor lower electrode 11 and contact plug CP1 is greater than the contact area between the capacitor upper electrodes 12 and ferroelectric layer 16. In the structure shown in FIG. 3K, the contact area between the capacitor lower electrode 11 and contact plug CP1 is double or more greater than the contact area between the capacitor upper electrode 12 and ferroelectric layer 16.

An interlayer insulating film 17 is formed on the interlayer insulating film 15, and then the interlayer insulating film 17 is made flat. Contact holes reaching the capacitor upper electrodes 12 are formed in the interlayer insulating film 17, following which oxygen recovery anneal (500° C., one hour) is carried out. During the anneal, the contact plug CP1 tends to be oxidized. In order to prevent oxidation of the contact plug CP1, it is desirable to form an $Al_2O_3$ layer (e.g. 500 Å thick) or an $Al_xSi_yO_z$ layer (e.g. 500 Å thick) before the formation of the interlayer insulating film 17 following the formation of the capacitor, or in the interlayer insulating film 17.

Barrier metal (e.g. TiN) and an AlCu layer or material containing Al are buried in the contact holes, thereby forming contact plugs CP2. Further, a contact plug CP3 is formed. The contact plug CP3 is connected to the other of the impurity diffusion layers of the cell transistor. A metal wiring layer 18 for connecting the contact plugs CP2 and CP3 is formed on the interlayer insulating film 18, and an interlayer insulating film 19 is formed on the interlayer insulating film 18. Thus, the series connected TC unit type ferroelectric RAM shown in FIG. 2B is obtained.

FIG. 3L is a cross-sectional view corresponding to FIG. 3K. It illustrates a structure in which the mask materials 34 and 25 are hard mask and a protective film of the type shown in FIG. 3I is formed. As FIG. 3L shows, the hard mask 24 remains on the capacitor upper electrode 12. The protective film 40 made of, for example, $Al_2O_3$ is provided on the sides of the capacitor upper electrode 12 and on the ferroelectric film 16 and the hard mask 24. The hard mask remains on the protective film 40. As shown in FIG. 3M, the ferroelectric film 16 is patterned in the same fashion as the capacitor upper electrode 12.

In the series connected TC unit type ferroelectric RAM according to the present embodiment, the contact resistance between the contact plug and the capacitor lower electrode can be reduced without preventing miniaturization of the memory cell. Therefore, the manufacturing cost can be reduced while the reliability of the memory cell is maintained. The advantages of this embodiment will now be described referring to FIG. 4A. FIG. 4A is an enlarged view of the memory cell.

As is shown in FIG. 4A, the contact plug CP1 that connects the impurity diffusion layer 27 of the cell transistor and the capacitor lower electrode 11 has a T-shape. The contact area d2 between the contact plug CP1 and capacitor lower electrode 11 is greater than the contact area d3 between the capacitor upper electrode 12 and ferroelectric layer 16. In particular, the former is double or more greater than the latter.

Unlike in the prior art, the contact area between the contact plug CP1 and capacitor lower electrode 11 can be increased and thus the resistance therebetween can be decreased. The contact area between the contact plug CP1 and capacitor lower electrode 11 is greater than the contact area between the contact plug CP1 and impurity diffusion layer 27. In short, the contact plug CP1 is substantially formed in a T-shape. In other words, the plug CP1 comprises a base and a projection extending downwards from the base. In addition, at least part of the gate electrode 13 overlaps part of the contact plug CP1. In other words, the gate electrode 13 is located nearly just below the cell capacitor CC, in particular, the capacitor lower electrode 11. Therefore, an increase in size of the memory cell can be suppressed, while the contact area between the contact plug CP1 and capacitor lower electrode 11 is increased. To be more specific, the distance between adjacent gate electrodes 13 can be made to remain the same as in the prior art.

The area d1 of the capacitor lower electrode 11 is greater than the area d2 of the upper surface of the contact plug CP1, that is, the surface opposed to the capacitor lower electrode 11. The capacitor lower electrode 11 covers the contact plug CP1. Accordingly, in the manufacturing process, damage to the contact plug CP1 can be suppressed. The multi-layer wiring forming steps following the formation of the memory cell includes a number of steps using plasma, such as a plasma CVD (Chemical Vapor Deposition) step. The plasma easily penetrates through the silicon oxide film that is a material of the interlayer insulation films. If the contact plug is exposed to the interlayer insulation film, the contact plug is damaged by the plasma. According to the structure of this embodiment, however, the upper surface of the contact plug CP1 is covered with the capacitor lower electrode 11. The capacitor lower electrode 11 functions like an umbrella. Thus, the plasma is blocked by the capacitor lower electrode 11 and will hardly reach the contact plug CP1. Therefore, plasma damage to the contact plug CP1 can be suppressed, and the reliability of the contact plug CP1 can be enhanced.

As has been described above, oxygen annealing is performed, in some cases, to recover the damage caused to the capacitor lower electrode 11 at the time of RIE. In this case, too, oxidation of the contact plug CP1 can be suppressed since the upper surface of the contact plug CP1 is covered with the capacitor lower electrode 11.

The contact plug CP1 may be shaped as illustrated in FIG. 4B. That is, the base of the plug CP1 may be rounded at its circumferential edge.

Figure 1B:
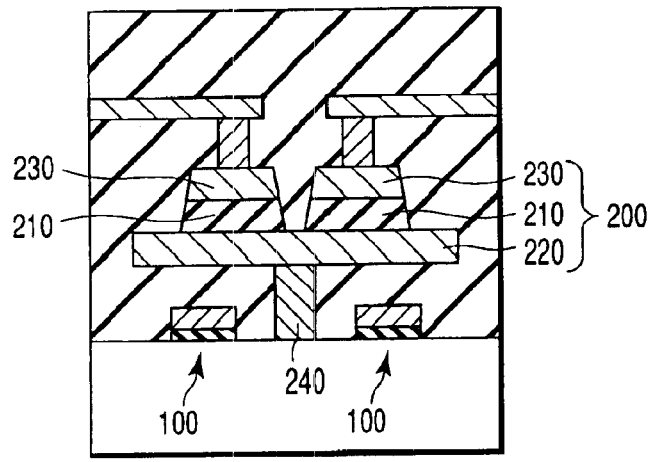
Figure 1C:
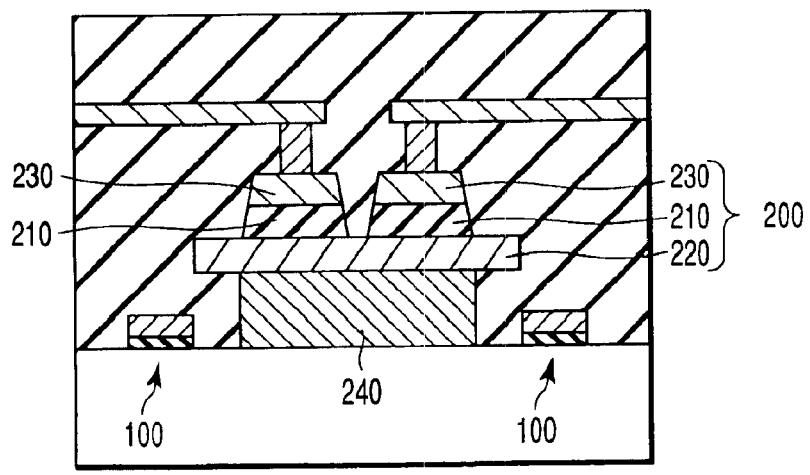
Figure 5:
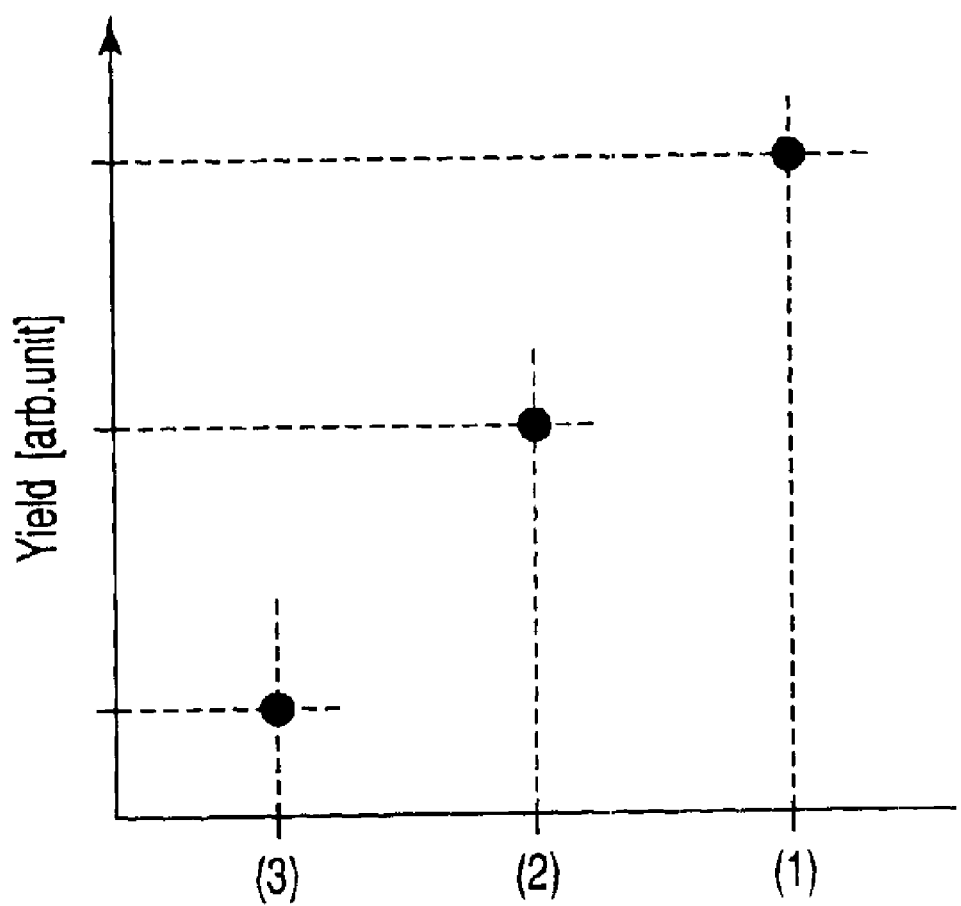
FIG. 5 is a graph showing manufacturing yields of the ferroelectric RAM of the first embodiment of the invention and the prior-art ferroelectric memory.

FIG. 5 is a graph showing manufacturing yields of the series connected TC unit type ferroelectric RAMs having the structure of the present embodiment and the structure of the prior art. In FIG. 5, (1) indicates the present embodiment, (2) designates the prior-art structure shown in FIG. 1A, and (3) represents the prior-art structure shown in FIG. 1B. It is understood that the structure of the present embodiment provides a much higher manufacturing field than the prior-art structures. It is thus understood that the manufacturing cost can be reduced.

Figure 6:
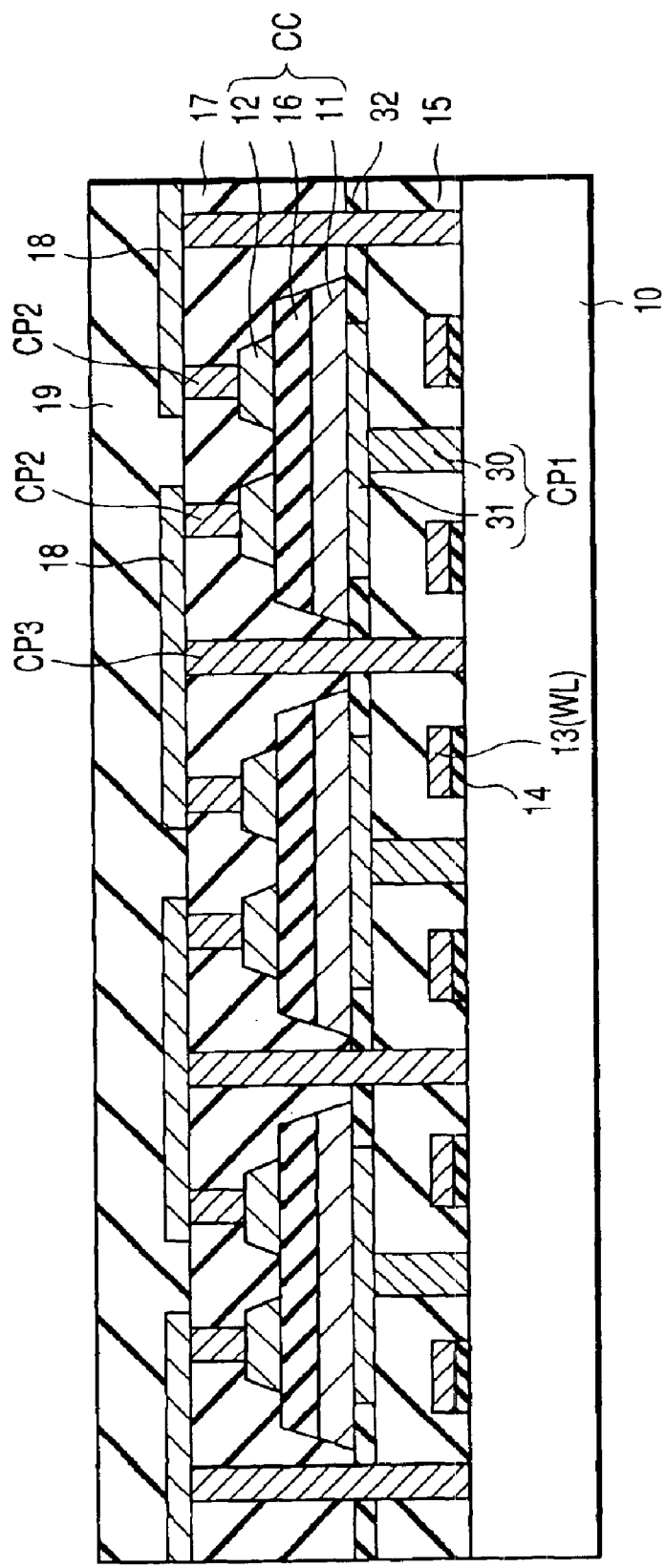
FIG. 6 is a cross-sectional view of a ferroelectric RAM according to a second embodiment of the present invention.

Referring now to FIG. 6, a semiconductor device according to a second embodiment of the present invention will now be described. In the second embodiment, a series connected TC unit type ferroelectric RAM will be described by way of example. FIG. 6 is a cross-sectional view of the series connected TC unit type ferroelectric RAM according to the second embodiment.

As is shown in FIG. 6, the series connected TC unit type ferroelectric RAM of the second embodiment differs from that of the first embodiment in that the contact plug CP1 is formed of two plug members. Specifically, a contact plug 30, which is connected to one of the impurity diffusion layers of the cell transistor, is formed in the interlayer insulating film 15. Another contact plug 31 is formed on the interlayer insulating film 15 and contact plug 30. The two contact plugs 30 and 31 correspond to the contact plug CP1 in the first embodiment. The cell capacitor CC is formed on the contact plug 31. The contact plug 31 corresponds to the buried region of the contact plug CP1 in the groove 21 in the first embodiment. The contact plug 31 overlaps, at least partially, the gate electrode 13.

A method of manufacturing the series connected TC unit type ferroelectric RAM according to the second embodiment will now be described with reference to FIGS. 7A to 7F. FIGS. 7A to 7F are cross-sectional views illustrating in succession the steps of fabricating the series connected TC unit type ferroelectric RAM of the second embodiment.

Element isolation regions are formed in a silicon substrate 10, like the first embodiment. A cell transistor is formed in a element region AA. Subsequently, an interlayer insulating film 15 is formed on the silicon substrate 10, and the interlayer insulating film 15 is flattened.

Figure 7A:
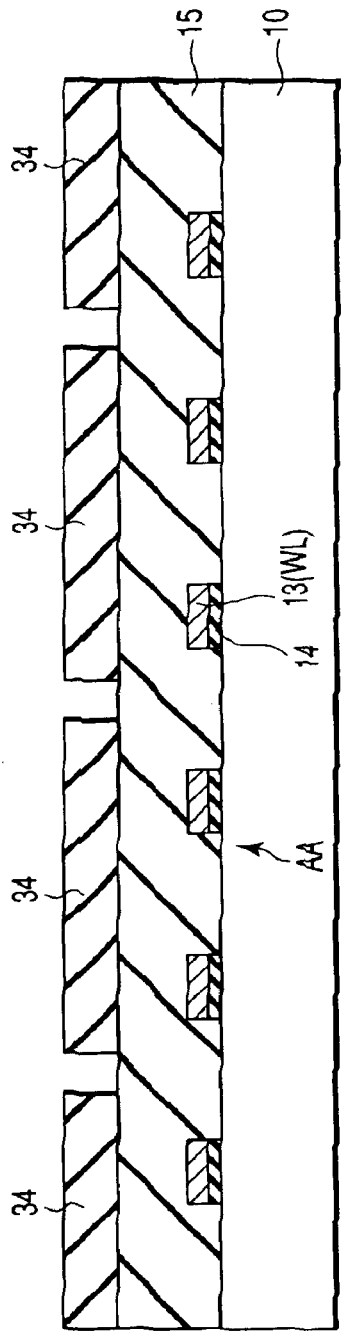
FIGS. 7A to 7F are cross-sectional views illustrating in succession the steps of manufacturing the ferroelectric RAM according to the second embodiment of the invention.

As is shown in FIG. 7A, a mask material 34 is formed on the interlayer insulating film 15. The mask material 34 is patterned, as shown in FIG. 7A, by means of photolithography and etching.

Figure 7B:
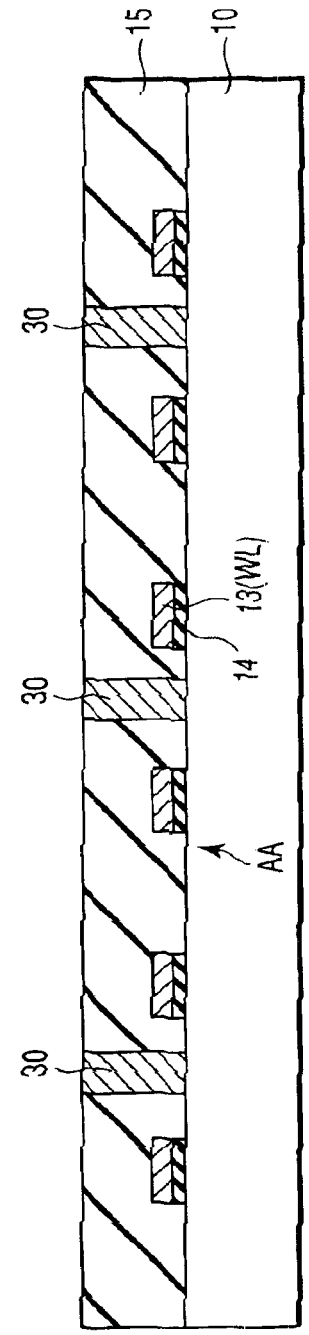

In a step shown in FIG. 7B, using the mask material 34 as a mask, the interlayer insulating film 15 is etched by RIE, thereby making a contact hole reaching one of the impurity diffusion layers of the cell transistor. The mask material 34 is then removed. A thin barrier metal layer (not shown) is formed on the inner wall of the contact hole and on the impurity diffusion layer exposed to the bottom of the contact hole. The barrier metal layer is formed of, e.g. a Ti/TiN multi-layer film. A plug material is formed on the barrier metal layer such that it is buried in the contact hole. The plug material is polished by CMP such that the plug material is left only in the contact hole. Thus, a contact plug 30, as shown in FIG. 7B, is formed. The plug material 23 to be buried in the contact hole is, e.g. tungsten or polysilicon.

Figure 7C:
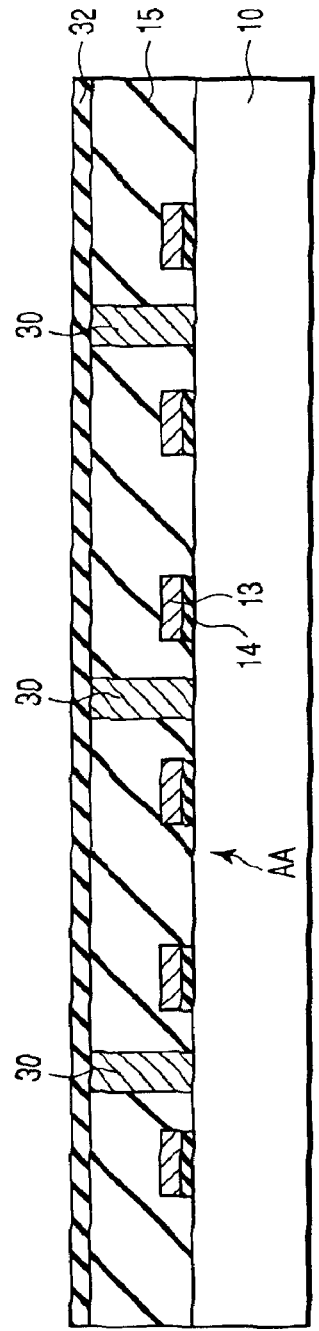
Figure 7D:
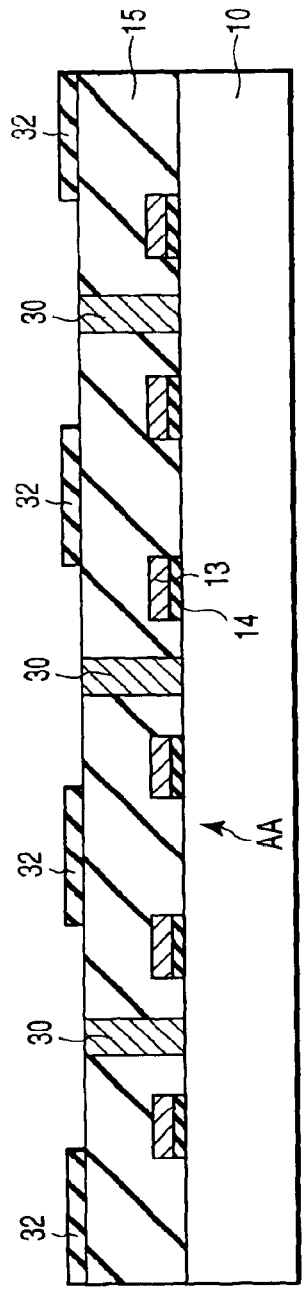

As is shown in FIG. 7C, an interlayer insulating film 32 is formed on the interlayer insulating film 15 and contact plug 30. The interlayer insulating film 32 is patterned, as shown in FIG. 7D, by means of photolithography and etching. The region where the interlayer insulating film 32 is removed corresponds to the groove 21 in the first embodiment. As a result, the upper surface of the contact plug 30 is exposed.

Figure 7E:
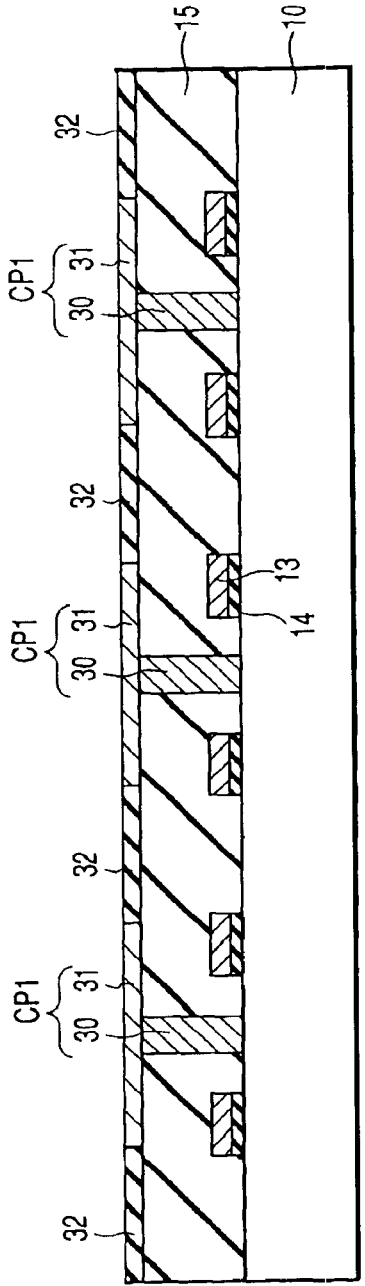

In a step shown in FIG. 7E, a thin barrier metal layer (not shown) is formed on the interlayer insulating films 15 and 32 and contact plug 30. The barrier metal layer is formed of, e.g. a Ti/TiN multi-layer film. A plug member 31 is formed on the barrier metal layer. The plug member 31 is formed of, e.g. tungsten or polysilicon. The plug member 31 is polished by means of CMP using the interlayer insulating film 32 as a stopper. Thereby, the plug member 31 is left only in the region between adjacent portions of the interlayer insulating film 32. Thus, a T-shaped contact plug CP1 having mutually connected contact plugs 30 and 31 is obtained. The contact plugs 30 and 31 may be formed of the same material or different materials.

Figure 7F:
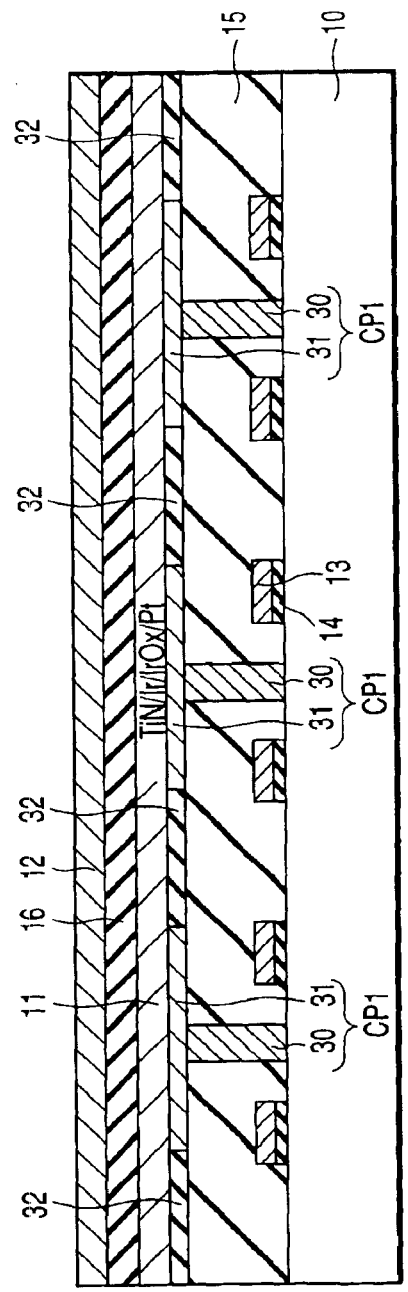

Next, a cell capacitor CC is formed on the contact plug CP1. Specifically, as shown in FIG. 7F, a capacitor lower electrode layer 11, a ferroelectric layer 16 and a capacitor upper electrode layer 12 are successively formed on the interlayer insulating film 15 and contact plug CP1.

Thereafter, the same steps as those shown in FIGS. 3H to 3K, which have been described in connection with the first embodiment, are carried out to complete the fabrication of the structure shown in FIG. 6.

The same advantages as with the first embodiment can be obtained by the structure and the manufacturing method according to the second embodiment.

Figure 8:
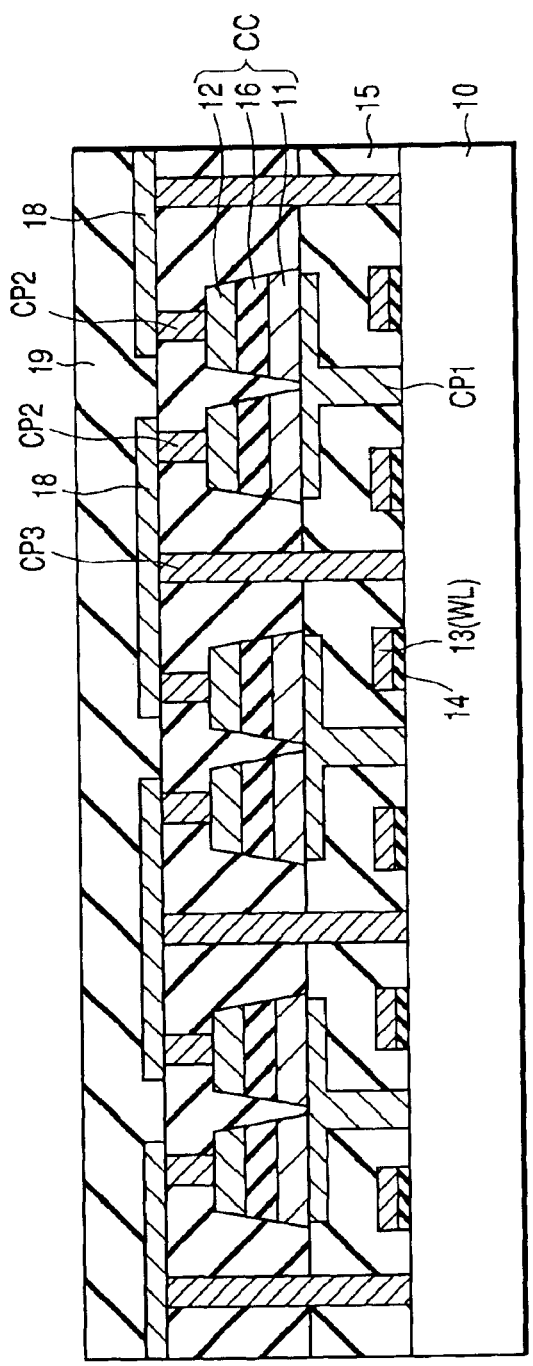
FIG. 8 is a cross-sectional view of a ferroelectric RAM according to a third embodiment of the present invention.

Referring now to FIG. 8, a semiconductor device according to a third embodiment of the present invention will now be described. In the third embodiment, a series connected TC unit type ferroelectric RAM will be described by way of example. FIG. 8 is a cross-sectional view of the series connected TC unit type ferroelectric RAM according to the third embodiment.

The series connected TC unit type ferroelectric RAM according to the third embodiment differs from that of the first embodiment in that the capacitor lower electrode 11 and ferroelectric film 16 are separated for individual cell capacitors. Specifically, two separated capacitor lower electrodes 11 are formed on the contact plug CP1. A ferroelectric film 16 and a capacitor upper electrode 12 are successively formed on each of the separated capacitor lower electrodes 11. The other structure is the same as those of the first embodiment, and a description thereof is omitted. The lower electrodes 11 may be connected to one another.

Besides, a method of manufacturing the semiconductor device of the third embodiment is realized by modifying the method of the first embodiment. That is, in the step of FIG. 3H of the first embodiment, using the mask material 24 as a mask, not only the capacitor upper electrode layer 12 but also the ferroelectric layer 16 and capacitor lower electrode 11 are patterned. The mask material 24 can of course be a hard mask. In this case, the hard mask need not be removed.

The same advantages as with the first embodiment can be obtained by the structure and the manufacturing method according to the third embodiment. According to the structure of the third embodiment, the contact plug CP1 is not completely covered by the capacitor lower electrodes 11. Thus, the present embodiment is particularly effective when oxygen annealing is not performed after the patterning of the capacitor lower electrode 11.

Figure 9:
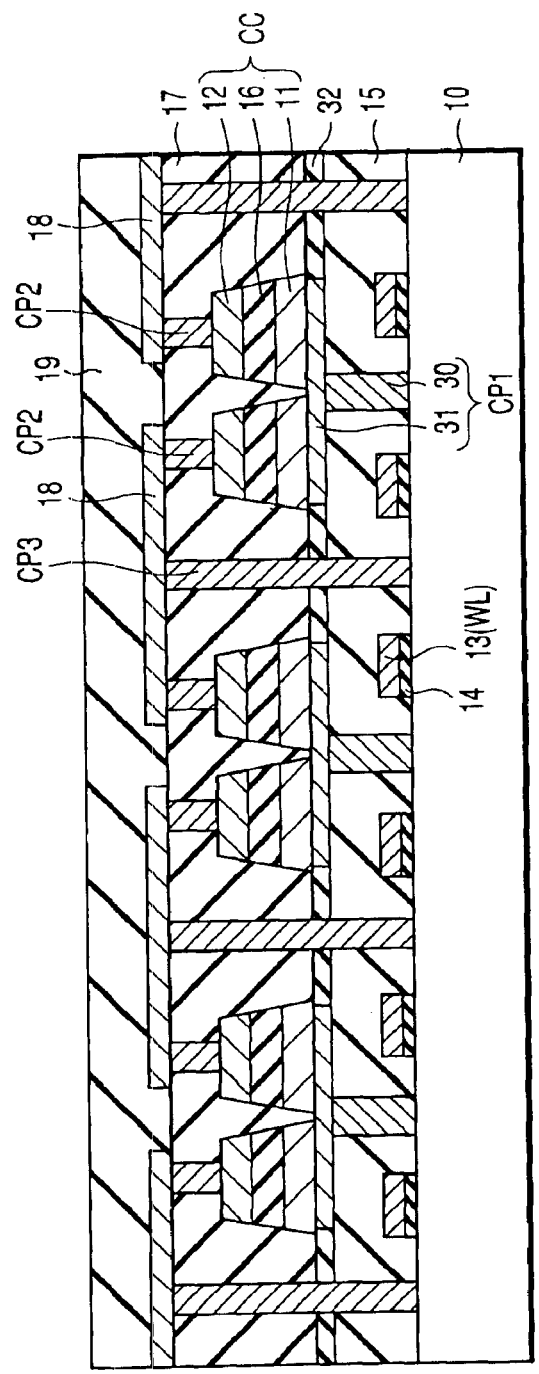
FIG. 9 is a cross-sectional view of a ferroelectric RAM according to a fourth embodiment of the present invention.

With reference to FIG. 9, a semiconductor device according to a fourth embodiment of the present invention will now be described. In the fourth embodiment, a series connected TC unit type ferroelectric RAM will be described by way of example. FIG. 9 is a cross-sectional view of the series connected TC unit type ferroelectric RAM according to the fourth embodiment.

The series connected TC unit type ferroelectric RAM according to the fourth embodiment is a combination of the second and third embodiments. As is shown in FIG. 9, the contact plug CP1 comprises two contact plugs 30 and 31. Mutually separated capacitor lower electrodes 11 are formed on the contact plug 31, and capacitor upper electrodes 12 are formed on the capacitor lower electrodes 11 with ferroelectric films 16 interposed therebetween.

The structure of the fourth embodiment can be obtained in the following manner. The structure shown in FIG. 7F according to the second embodiment is first obtained. Then, in the step of FIG. 3H according to the first embodiment, the capacitor upper electrode 12, ferroelectric film 16 and capacitor lower electrode 11 are patterned.

The same advantages as with the first embodiment can be obtained by the structure and the manufacturing method according to the fourth embodiment.

As has been described above, according to the semiconductor devices of the first to fourth embodiments, the contact plug CP1 connecting the cell transistor and cell capacitor lower electrode has a T-shape. Hence, the contact area between the contact plug CP1 and capacitor lower electrode 11 is greater than the contact area between the capacitor upper electrode 12 and ferroelectric layer 16. In particular, the former is double or more greater than the latter. On the other hand, the contact area between the contact plug CP1 and capacitor lower electrode 11 is less than the area of that surface of the capacitor lower electrode 11, which faces the contact plug CP1. Moreover, the capacitor lower electrode 11 overlaps at least a part of the gate electrode 13 of the cell transistor.

Therefore, the resistance between the contact plug and the cell capacitor can be reduced, and the reliability of the cell capacitor can be enhanced. At the same time, it is possible to decrease the possibility that miniaturization of the memory cell is hindered.

The fabrication steps described in connection with the first to fourth embodiments are merely examples. For instance, the contact plug CP1 may be formed according to a method illustrated in FIGS. 10A to 10C. FIGS. 10A to 10C are cross-sectional views illustrating in succession the steps of manufacturing a ferroelectric RAM according to a modification of the first to fourth embodiments of the invention.

After a cell transistor and an interlayer insulating film 15 are formed on the silicon substrate 10, a mask material 35 is formed on the interlayer insulating film 15. Then, as shown in FIG. 10A, the mask material 35 is patterned, and a contact hole 22 is made by means of RIE using the mask material 35 as a mask. This step corresponds to FIGS. 7A and 7B described in connection with the second embodiment. In this modification, the contact hole 22 is made such that it does not reach the impurity diffusion layer of the cell transistor. The mask material 35 is then removed.

In a step shown in FIG. 10B, a mask material 36 is formed on the interlayer insulating film 15. The mask material 36 is patterned in accordance with a formation pattern of the groove 21, as described referring to FIG. 3A in connection with the first embodiment.

Then, as shown in FIG. 10C, the interlayer insulating film 15 is etched by means of RIE using the mask material 36 as a mask. As a result, the groove 21 is made on the surface of the interlayer insulating film 15 and at the same time that portion of the interlayer insulating film 15, which lies at the bottom of the contact hole 22, is etched away. Thus, the contact hole 22 reaches the impurity diffusion layer.

Subsequently, a plug material is buried in the groove 21 and contact hole 22, and the contact plug CP1 is obtained.

FIGS. 11A to 11D are cross-sectional views illustrating in succession the steps of manufacturing a ferroelectric RAM according to a modification of the first to fourth embodiments of the invention. As is shown in these Figures, a silicide film 37 may be formed on the upper surface of the contact plug CP1, when the polysilicon is used as the material of the contact plug CP1 in the structure shown in FIG. 2B, FIG. 6, FIG. 8 and FIG. 9 as described in connection with the first to fourth embodiments. The silicide film 37 is formed of, e.g. $Co_xSi_y$ or $Ti_xSi_y$. In this case, the contact resistance between the contact plug CP1 and capacitor lower electrode 11 can further be reduced.

In the first to fourth embodiments, a material containing iridium (Ir) was used as the material of the capacitor electrode, and PZT was used as the material of the capacitor insulating film. However, the following electrode materials, for instance, may be used: elements of the platinum group such as platinum (Pt), palladium (Pd), osmium (Os) and rhodium (Rh); a material including other conductive film material such as rhenium (Re); alloys of these materials; and conductive metal oxides of these metals such as $SrRuO_3$ (SRO) or $RuO_x$. The capacitor insulating film may be formed of the following materials: ferroelectric film materials including any one of barium (Ba), strontium (Sr), lead (Pb), titanium (Ti), zirconium (Zr) and tantalum (Ta); for instance, $Ta_xTi_yO_z$, lead titanate ($PbTiO_3$: PTO), strontium titanate ($Sr_xTi_yO_z$: STO), barium titanate ($Ba_xTi_yO_z$: BTO), barium-strontium titanate ($Ba(Sr_{1-x}Ti_x)O_3$: BST), or strontium-bismuth tantalate ($SrBi_xTa_yO_z$: SBT). The silicide film can be formed in the following sequence of steps. First, a layer of Co, Ni, Ti or similar metal is formed on the contact plug CP1 after the structure of FIG. 3F has been provided. Then, a heat treatment is performed on the resultant structure, forming a silicide layer on the surface of the contact plug CP1. Further, the CMP is again carried out on the interlayer insulating film 15, by using a stopper. Further, as the material of the contact plug CP1, at least one kind selected from the group including polysilicon, tungsten (W), $Ti_xN_y$, $Ti_xAl_yN_z$, $W_xN_y$, iridium (Ir), $IrO_x$, platinum (Pt), $Pt_xO_y$, $SrRuO_3$, $Co_xSi_y$, $Ti_xSi_y$, $Ti_xAl_yO_z$, and $TiAl_xN_yO_z$ can be used. As the material of the contact plug CP2, copper (Cu) can be used. Further, as the material of the interconnecting metal layer, copper (Cu), aluminum (Al), tungsten (W), TiN, TiAlN, and titanium (Ti) can be used.

In the above embodiments, the series connected TC unit type ferroelectric RAM was described by way of example. The embodiment is not limited to this, and is applicable to, for instance, a DRAM, an MRAM (Magneto-resistive Random Access Memory), and a memory-embedded logic.

Figure 12:
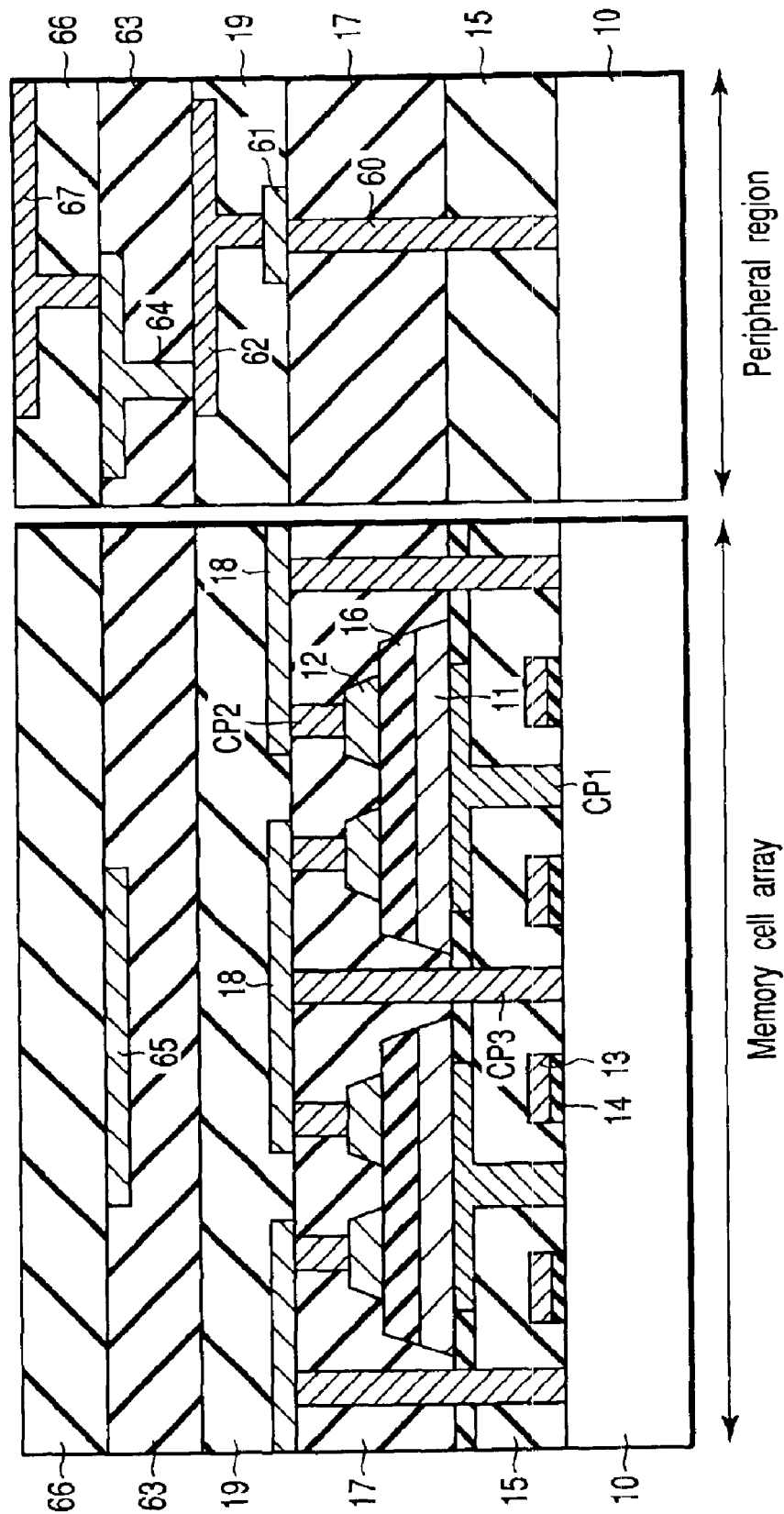
FIG. 12 is a cross-sectional view of an LSI including the ferroelectric RAM according to the first to fourth embodiments of the invention.

In the embodiment described above, the interconnecting metal layer 18 is formed by means of RIE. In an LSI-embedded memory of the type shown in FIG. 12 it is desired that RIE be performed to form an interconnecting metal layer 18 as in the embodiment described above, and that damascene process, for example dual-damascene process, be performed to layers above the layer 18, as well as contact plugs 62, 64 and 67. If the interconnecting metal layer 18, i.e., the first layer, is formed by RIE and the second interconnecting layer et seq. that lie above the first layer 18 are formed by the dual-damascene process, the yield of the LSI-embedded memory will increase.

Figure 13:
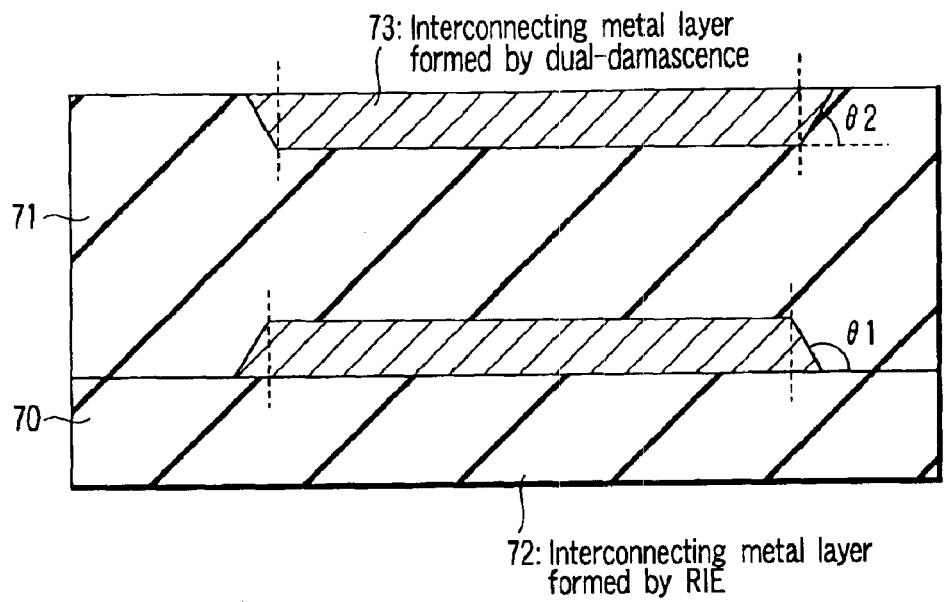
FIG. 13 is a cross-sectional view of an interconnecting metal layer.

An interconnecting metal layer formed by RIE and an interconnecting layer formed by the dual-damascene process differ in cross-sectional shape. FIG. 13 shows two interconnecting metal layers 72 and 73 that have been formed by RIE and dual-damascene process, respectively. The sides of either layer are not perpendicular to the semiconductor substrate. Rather, they incline to the semiconductor substrate. The layer 72 formed by RIE has a larger area at the bottom than at the top; its sides incline to the substrate, at an obtuse angle θ1. By contrast, the layer 73 formed by the dual-damascene process has a smaller area at the bottom than at the top; its sides incline to the substrate, at an acute angle θ2.

In each embodiment described above, either a photoresist or a hard mask is used in the process of patterning each layer. If a hard mask is used, it may be removed or not removed after the process is performed.

Figure 14:
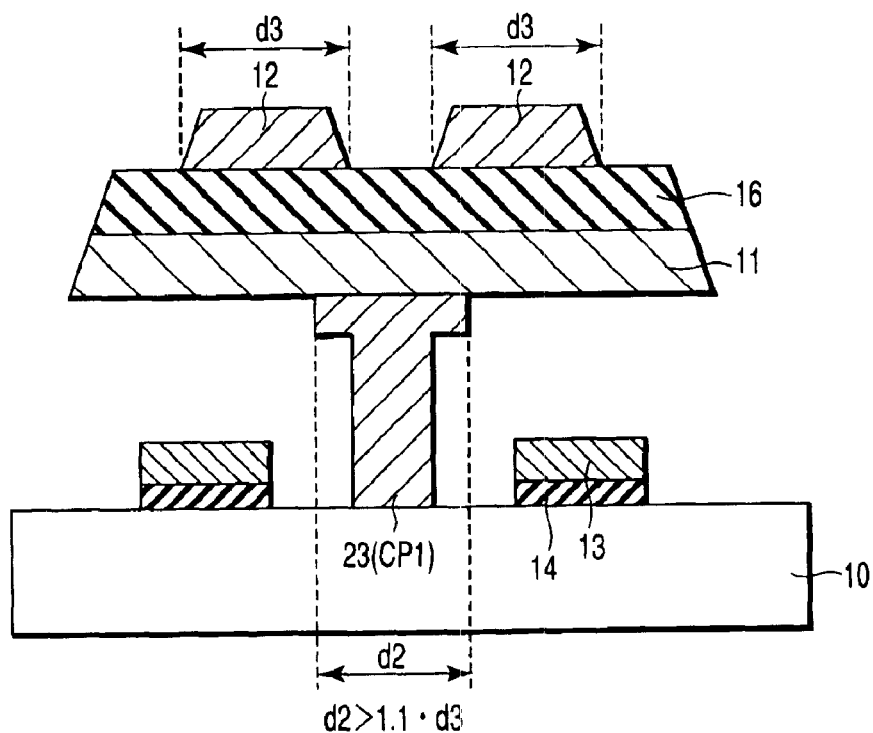
FIG. 14 is a cross-sectional view of the ferroelectric RAM according to the first to fourth embodiments of the invention.
Figure 15:
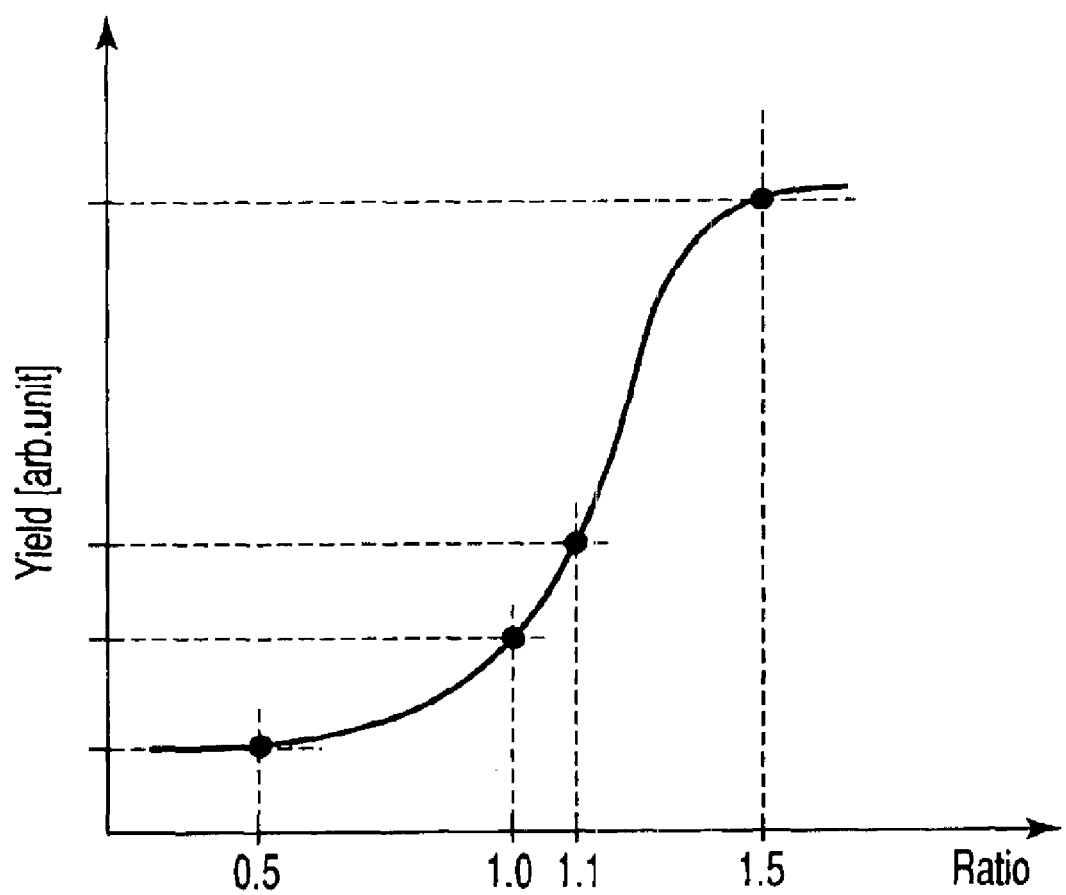
FIG. 15 is a graph showing manufacturing yields of the ferroelectric RAM according to the first to fourth embodiments of the invention and the prior-art ferroelectric memory.
Figure 16A:
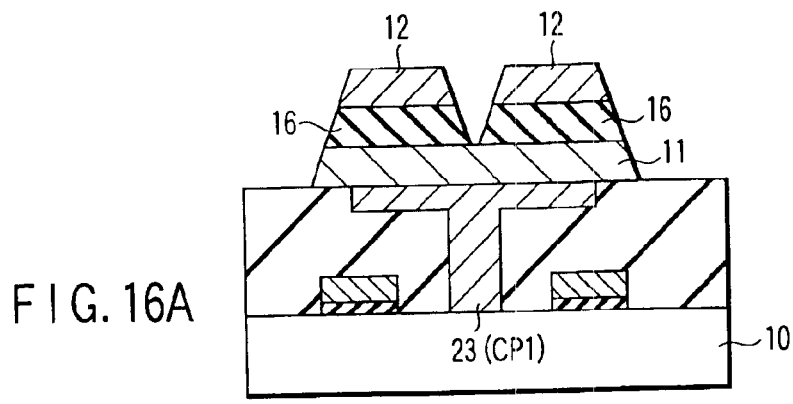
FIGS. 16A to 16D are cross-sectional views of the ferroelectric RAM according to a modification of the first to fourth embodiments of the invention.
Figure 16B:
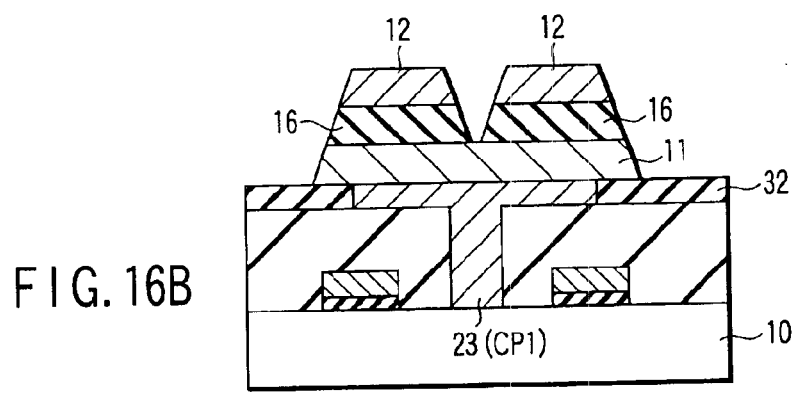
Figure 16C:
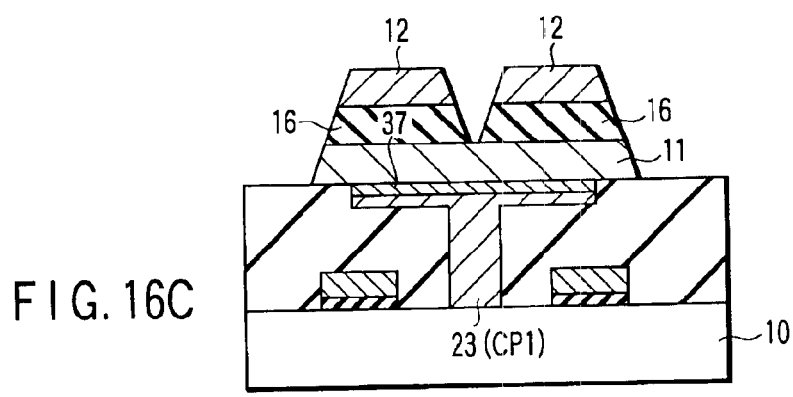
Figure 16D:
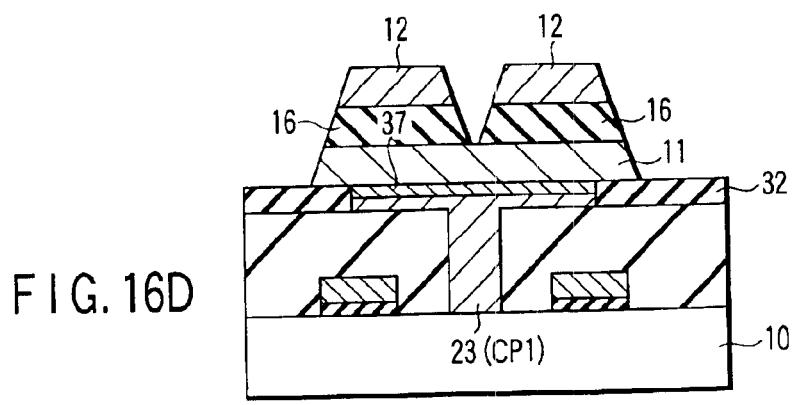
Figure 17A:
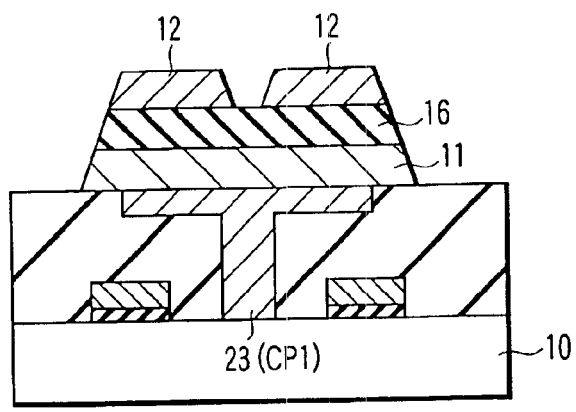
FIGS. 17A to 17D are cross-sectional views of the ferroelectric RAM according to a modification of the first to fourth embodiments of the invention.
Figure 17B:
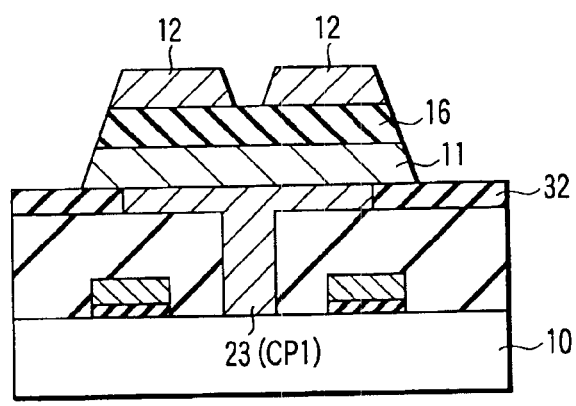
Figure 17C:
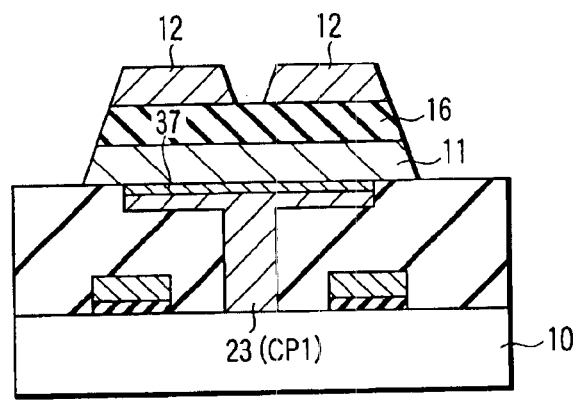
Figure 17D:
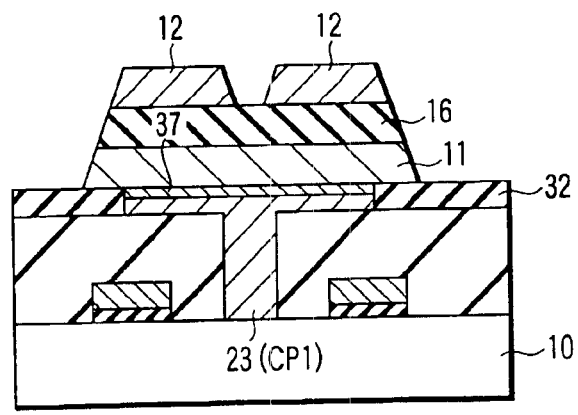

In the embodiment, the capacitor lower electrode 11 contacts the contact plug CP1 at an area that is at least two times as large as the area at which the capacitor upper electrode 12 contacts the ferroelectric film 16. Nonetheless, it suffices if the contact area of the electrode 11 and contact plug CP1 may be at least 1.1 times as large as the contact area of the electrode 12 and ferroelectric film 16, as illustrated in FIG. 14. This holds true of all embodiments of this invention. FIG. 15 is a graph that shows the relation between the yield of the product and the ration of the contact area of the electrode 11 and plug CP1 to the contact area of the electrode 12 and ferroelectric film 16, where the contact area of the electrode 12 and film 16 is 0.5 μm×0.5 μm. As seen from FIG. 15, the yield abruptly increases if the ratio is 1.1 or more. Hence, the ratio is not limited to 2. It suffices if the ratio is 1.1 or more.

In FIGS. 8, 9, 11C and 11D, explained are the cases where the capacitor upper electrode 12, the ferroelectric film 16, and the capacitor lower electrode 11 are patterned by one lithography step. However, if the ferroelectric capacitor is further miniatuarized, there are cases where the ferroelectric film 16 and the capacitor lower electrode 11 cannot be completely patterned. FIGS. 16A to 16D and FIGS. 17A to 17D show such cases.

Specifically, FIGS. 16A to 16D show the cases where the capacitor lower electrode 11 could not be patterned, although the ferroelectric film 16 was patterned. As shown in the figures, the electrode 11 is shared between two ferroelectric capacitors. FIGS. 17A to 17D show that not only the capacitor lower electrode 11 but also the ferroelectric film 16 could not be patterned. As shown in the figures, the electrode 11 and the film 16 are shared between two ferroelectric capacitors. Even in such cases, no problems occur in operation as long as separate capacitor upper electrodes are provided for respective ferroelectric capacitors. In the structures shown in FIGS. 16A to 16D and FIGS. 17A to 17D, a side wall of the capacitor lower electrode 11, a side wall of the ferroelectric film 16, and a side wall of the capacitor upper electrode 12 are located to exist on the same plane.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a MOS transistor formed on a semiconductor substrate;
    an interlayer insulating film formed on the semiconductor substrate such that the interlayer insulating film covers the MOS transistor;
    a contact plug formed in the interlayer insulating film and connected to an impurity diffusion layer of the MOS transistor;
    a capacitor lower electrode formed on the contact plug;
    a ferroelectric film formed on the capacitor lower electrode; and
    two capacitor upper electrodes formed on the capacitor lower electrode with the ferroelectric film interposed therebetween, a contact area between the contact plug and the capacitor lower electrode being greater than a contact area between each of the two capacitor upper electrodes and the ferroelectric film, and at least a part of a gate electrode of the MOS transistor being located just below a region of the contact plug, which region is in contact with the capacitor lower electrode.

2. The semiconductor device according to claim 1, wherein the capacitor lower electrode includes first and second electrode portions which are formed on the contact plug and separated from each other, and
    the two capacitor upper electrodes are formed on the first and second electrode portions, with the ferroelectric film interposed therebetween.

3. The semiconductor device according to claim 1, wherein the contact area between the contact plug and the capacitor lower electrode is at least 1.1 times the contact area between the capacitor upper electrode and the ferroelectric film.

4. The semiconductor device according to claim 1, wherein the contact area between the contact plug and the capacitor lower electrode is double or more greater than the contact area between each of the two capacitor upper electrodes and the ferroelectric film.

5. The semiconductor device according to claim 1, wherein the contact area between the contact plug and the capacitor lower electrode is less than an area of a surface of the capacitor lower electrode, which surface faces the contact plug.

6. The semiconductor device according to claim 1, wherein the capacitor lower electrode includes a metal element belonging to the platinum group.

7. The semiconductor device according to claim 1, further comprising:
    a silicide film formed between the capacitor lower electrode and the contact plug.

8. The semiconductor device according to claim 1, further comprising:
    a first interconnecting metal layer formed by RIE and connected to the capacitor upper electrode; and
    a second interconnecting metal layer formed by a damascene process and located above the first metal interconnecting layer.

9. The semiconductor device according to claim 1, wherein the MOS transistor and a capacitor element including the capacitor lower electrode, the ferroelectric film and the capacitor upper electrode constitute a unit cell of the series connected TC unit type ferroelectric RAM.

10. The semiconductor device according to claim 1, wherein a side surface of the capacitor lower electrode, a side surface of the ferroelectric film, and a side surface of the capacitor upper electrode exist on the same plane.

11. The semiconductor device according to claim 1, wherein the contact plug is formed of at least one kind selected from the group including polysilicon, tungsten, $Ti_xN_y$, $Ti_xAl_yN_z$, $W_xN_y$, iridium, $IrO_x$, platinum, $Pt_xO_y$, $SrRuO_3$, $Co_xSi_y$, $Ti_xSi_y$, $Ti_xAl_yO_z$, and $TiAl_xN_yO_z$.

12. A semiconductor device comprising:
    two MOS transistors formed on a semiconductor substrate and sharing one of source and drain regions thereof;
    an interlayer insulating film formed on the semiconductor substrate such that the interlayer insulating film covers the MOS transistors;
    a contact plug including a first plug portion formed in the interlayer insulating film and connected to one of the source and drain regions shared by the two MOS transistor, and a second plug portion formed on the first plug portion and extending from a region of contact with the first plug portion to a region above at least a part of a gate electrode of each of the two MOS transistors;
    a capacitor lower electrode formed on the second plug portion of the contact plug;
    a ferroelectric film formed on the capacitor lower electrode; and
    two capacitor upper electrodes formed on the ferroelectric film, each of the two capacitor upper electrodes overlapping at least a part of the gate electrode of an associated one of the MOS transistors, a contact area between the second plug portion and the capacitor lower electrode being greater than a contact area between each of the two capacitor upper electrodes and the ferroelectric film.

13. The semiconductor device according to claim 12, wherein the contact area between the contact plug and the capacitor lower electrode is less than an area of a surface of the capacitor lower electrode, which surface faces the contact plug.

14. The semiconductor device according to claim 12, wherein the capacitor lower electrode includes a metal element belonging to the platinum group.

15. The semiconductor device according to claim 12, further comprising:
a silicide film formed between the capacitor lower electrode and the contact plug.

16. The semiconductor device according to claim 12, wherein the MOS transistor and a capacitor element including the capacitor lower electrode, the ferroelectric film and the capacitor upper electrode constitute a unit cell of the series connected TC unit type ferroelectric RAM.

17. The semiconductor device according to claim 12, further comprising:
a first interconnecting metal layer formed by RIE and connected to the capacitor upper electrode; and
a second interconnecting metal layer formed by a damascene process and located above the first metal interconnecting layer.

18. The semiconductor device according to claim 12, wherein a side surface of the capacitor lower electrode, a side surface of the ferroelectric film, and a side surface of the capacitor upper electrode exist on the same plane.

19. The semiconductor device according to claim 12, wherein the contact plug is formed of at least one kind selected from the group including of polysilicon, tungsten, $Ti_xN_y$, $Ti_xAl_yN_z$, $W_xN_y$, iridium, $IrO_x$, platinum, $Pt_xO_y$, $SrRuO_3$, $Co_xSi_y$, $Ti_xSi_y$, $Ti_xAl_yO_z$, and $TiAl_xN_yO_z$.

20. A method for fabricating a semiconductor device comprising:
forming a MOS transistor on a semiconductor substrate;
forming a first interlayer insulating film on the semiconductor substrate, the first interlayer insulating film covering the MOS transistor;
forming a contact plug in the first interlayer insulating film, the contact plug being connected to an impurity diffusion layer of the MOS transistor;
forming a capacitor lower electrode on the contact plug;
forming a ferroelectric film on the capacitor lower electrode; and
forming two capacitor upper electrodes on the capacitor lower electrode with the ferroelectric film interposed therebetween, a contact area between the contact plug and the capacitor lower electrode being greater than a contact area between each of the two capacitor upper electrodes and the ferroelectric film, and a region of the contact plug, which region is in contact with the capacitor lower electrode, being located just above at least a part of a gate electrode of the MOS transistor.

21. The method according to claim 20, wherein forming the capacitor lower electrode includes:
forming a conductive layer on the first interlayer insulating film and the contact plug; and
patterning the conductive layer and forming first and second electrode portions on the contact plug, the first and second electrode portions being separated from each other, and
the two capacitor upper electrodes are formed on the first and second electrode portions, with the ferroelectric film interposed therebetween.

22. The method according to claim 20, wherein forming the contact plug includes:
making a trench in a surface portion of the first interlayer insulating film;
making a contact hole in the first interlayer insulating film, the contact hole having an open end located in the trench and having a bottom reaching the impurity diffusion layer;
forming a plug material on the first interlayer insulating film, thus burying the plug material in the contact hole and the trench; and
polishing the plug material using the first interlayer insulating film as a stopper, thereby leaving the plug material only in the contact hole and the trench.

23. The method according to claim 20, wherein forming the contact plug includes:
making a contact hole in the first interlayer insulating film, the contact hole having a depth not reaching the impurity diffusion layer;
etching a surface of the first interlayer insulating film, thus forming a trench including an open end of the contact hole, and at the same time etching a bottom portion of the contact hole such that the bottom portion of the contact hole reaches the impurity diffusion layer;
forming a plug material on the first interlayer insulating film, thus burying the plug material in the contact hole and the trench; and
polishing the plug material using the first interlayer insulating film as a stopper, thereby leaving the plug material only in the contact hole and the trench.

24. The method according to claim 20, wherein forming the contact plug includes:
forming a contact hole in the first interlayer insulating film, the contact hole reaching the impurity diffusion layer;
burying a first plug material in the contact hole, thus forming a first plug;
forming a second interlayer insulating film on the first interlayer insulating film;
forming a trench in the second interlayer insulating film, the trench having a depth reaching the first interlayer insulating film, and exposing the first plug in the trench; and
burying a second plug material in the trench, thus forming a second plug.

25. The method according to claim 24, wherein the first and second plug materials are different materials.

26. The method according to claim 24, wherein the first and second plug materials are the same material.

27. The method according to claim 22, wherein the trench is formed to overlap at least a part of a gate electrode of the MOS transistor.

28. The method according to claim 23, wherein the trench is formed to overlap at least a part of a gate electrode of the MOS transistor.

29. The method according to claim 24, wherein the trench is formed to overlap at least a part of a gate electrode of the MOS transistor.

30. The method according to claim 20, further comprising:
performing RIE after forming the two capacitor upper electrodes, thereby forming first interconnecting metal layers which are connected to the two capacitor upper electrodes, respectively; and
performing a damascene process, thereby forming a second interconnecting metal layer at a level higher than the first metal interconnecting layers.

* * * * *